United States Patent
Harvey et al.

(10) Patent No.: US 12,195,484 B1
(45) Date of Patent: Jan. 14, 2025

(54) MOLECULAR COMPLEXES

(71) Applicant: The United States of America, as represented by the Secretary of the Navy, Arlington, VA (US)

(72) Inventors: Benjamin G. Harvey, Ridgecrest, CA (US); Kenneth R. McClain, Ridgecrest, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 220 days.

(21) Appl. No.: 17/066,654

(22) Filed: Oct. 9, 2020

(51) Int. Cl.
*C07F 5/02* (2006.01)
*C07F 5/00* (2006.01)
*C07F 17/00* (2006.01)
*G11C 13/02* (2006.01)

(52) U.S. Cl.
CPC ............... *C07F 5/02* (2013.01); *C07F 5/00* (2013.01); *C07F 17/00* (2013.01); *G11C 13/02* (2013.01)

(58) Field of Classification Search
CPC .............. C07F 17/00; C07F 5/00; C07F 5/02
See application file for complete search history.

(56) References Cited

PUBLICATIONS

Roitershtein (Inorganic Chemistry; 2018, 57, 10199-10213).*
Maginn (Journal of the American Chemical Society; 1963, 85, 6, 672-676).*
Edelmann (Chemical Reviews; 2002, vol. 102, No. 6, 1851-1896).*
Kilimann (Angew. Chem. Int. Ed. Engl., 1994, 33, No. 15/16, pp. 1618-1621).*
Evans (J. Am. Chem. Soc., vol. 106, No. 15, 1984, pp. 4270-4272).*
Evans (Journal of the American Chemical Society, 1978, 100:1, 331-333).*

* cited by examiner

*Primary Examiner* — Pancham Bakshi
(74) *Attorney, Agent, or Firm* — Naval Air Warfare Center Weapons Division; Matthew D. Pangallo; Edu A. Enin-Okut

(57) ABSTRACT

A molecular complex including a cationic lanthanide metal, two anionic ligands bonded to the cationic lanthanide metal, and a non-coordinating anion. The two anionic ligands bonded to the cationic lanthanide metal selected from the group consisting of an anionic carbon ring ligand, an anionic monodentate ligand, an anionic polydentate ligand, and combinations thereof.

4 Claims, 27 Drawing Sheets

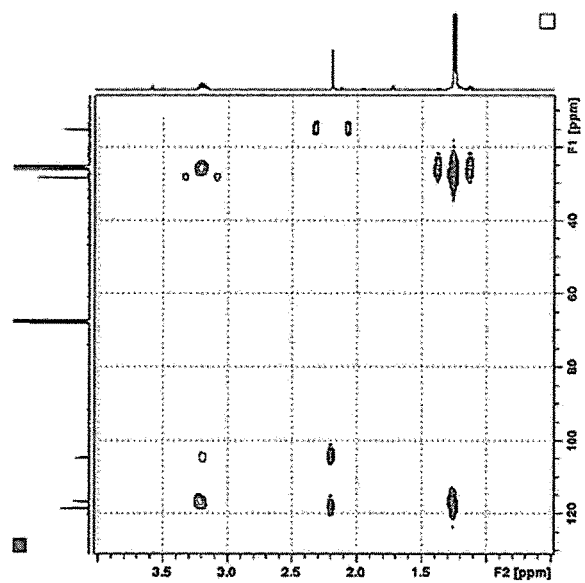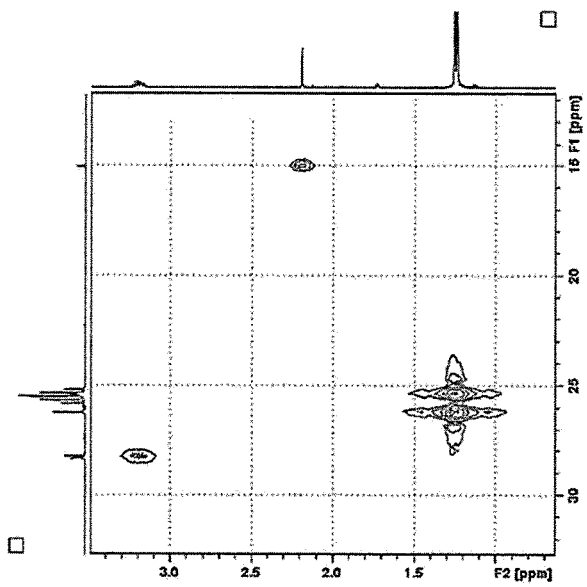
FIG. 17A　　　　　　　　　　　FIG. 17B
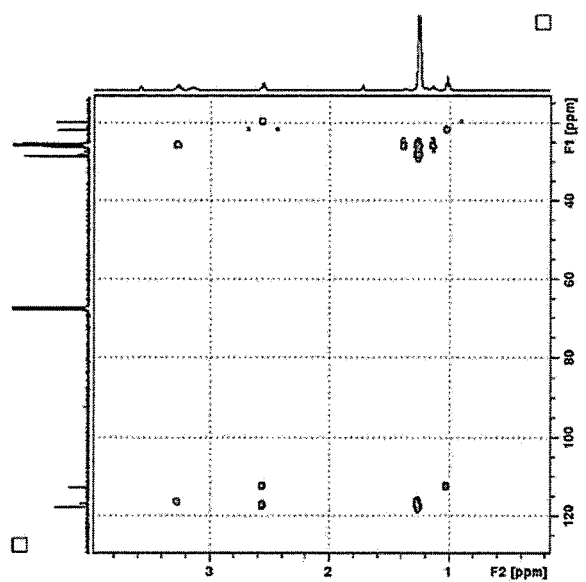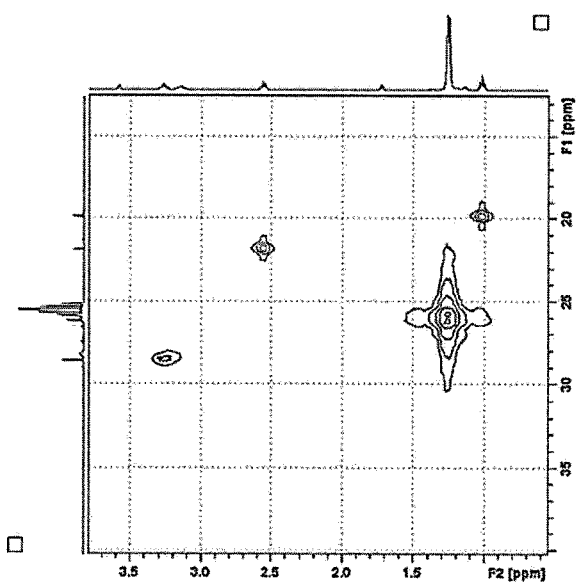
FIG 17C　　　　　　　　　　　FIG. 17D

US 12,195,484 B1

MOLECULAR COMPLEXES

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

CROSS-REFERENCE TO RELATED APPLICATION

This is a non-provisional application claiming the benefit of the parent provisional application Ser. No. 62/916,332 filed on Oct. 17, 2019. The entire disclosure of the parent provisional application Ser. No. 62/916,332 is incorporated herein by reference.

BACKGROUND

Single molecule magnets (SMMs) are molecules which can be magnetized using a magnetic field and remain magnetized after the magnetic field is removed. This ability may allow the possibility for each molecule to store one bit of information. The storage of one bit of information in a single molecule provides a significant increase in the storage capacity compared to current storage devices. Due to this characteristic, SMMs have potential applications in quantum computing and magnetic data storage.

BRIEF DESCRIPTION OF THE DRAWINGS

Features and advantages of examples of the present disclosure will be apparent by reference to the following detailed description and drawings, in which like reference numerals correspond to similar, but in some instances, not identical, components. Reference numerals or features having a previously described function may or may not be described in connection with other drawings in which they appear.

FIG. 17A-FIG. 17D are 2D NMR spectra of different cyclopentadienyl ligands described herein mixed in THF-d$_8$;

DETAILED DESCRIPTION

Figure 1:
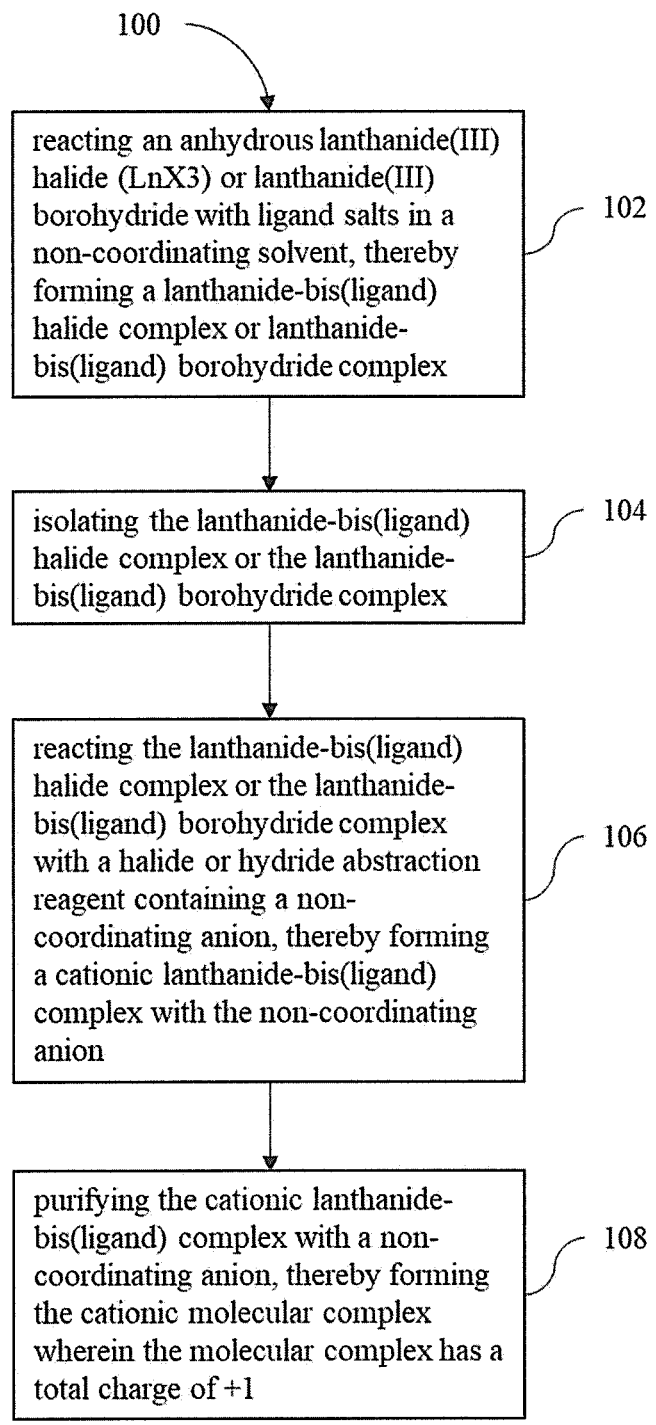
FIG. 1 is a is a flow diagram illustrating an example of a method for making a cationic molecular complex described herein.

Single molecule magnets (SMMs) have demonstrated potential applications in spin-based computing and magnetic data storage. In order for SMMs to be functional in spin-based computing and magnetic data storage, the SMMs must possess slow magnetic relaxation times at reasonable temperatures. In other words, the SMMs must remain magnetized for a period of time after an external magnetic field is removed. However, in current technology, the SMMs are limited by requiring extremely low operating temperatures (e.g., equal to or less than 60 K) to achieve slow magnetic relaxation. In addition, the best SMMs have been limited to lanthanide metal salts. Due to the temperature requirements, SMMs are still difficult to use in practical applications.

In the invention herein, an SMM is produced with a lanthanide-based system to form a molecular complex. The lanthanide elements are used in SMMs due to their spin-orbit coupled ground states and large single-ion anisotropies when paired with the appropriate ligands. In particular, lanthanide elements possess contracted valence 4f orbitals that interact weakly with ligand fields, a characteristic that affects both molecular structure and magnetism. In part, the molecular complex herein may be a series of lanthanide metallocenium molecular complexes that exhibit magnetic hysteresis at temperatures as high as 72 K. The reduction in cooling requirements to achieve magnetic hysteresis is a significant improvement compared to other SMMs, which may provide the possibility for use in practical applications. Additionally, the invention herein is not limited to molecular complexes composed of lanthanide metallocenium salts. Neutral molecular complexes, such as divalent metallocenes, may be used, which are soluble in non-polar solvents, thermally stable at elevated temperatures, and may be sufficiently volatile at very low pressures to allow sublimation onto surfaces. Therefore, the scope of possible molecular complexes has been broadened to molecules that are more desirable.

Three methods for making molecular complexes (e.g., SMMs) are disclosed herein that corresponds to making a molecular complex with a total charge of +1, 0, and −1. Each method and the corresponding molecular complex produced from the method are discussed in greater detail below.

First, a method for making a cationic molecular complex with a total charge of +1 is disclosed herein. The method includes reacting an anhydrous lanthanide(III) halide (LnX3) or lanthanide(III) borohydride with ligand salts in a non-coordinating solvent, thereby forming a lanthanide-bis(ligand) halide complex or lanthanide-bis(ligand) borohydride complex, isolating the lanthanide-bis(ligand) halide complex or the lanthanide-bis(ligand) borohydride complex, reacting the lanthanide-bis(ligand) halide complex or the lanthanide-bis(ligand) borohydride complex with a halide or hydride abstraction reagent containing a non-coordinating anion, thereby forming a cationic lanthanide-bis(ligand) complex with a non-coordinating anion, and purifying the cationic lanthanide-bis(ligand) complex with a non-coordinating anion, thereby forming the cationic molecular complex with a charge of +1.

Referring now to FIG. 1, the reaction 102 of method 100 includes reacting an anhydrous lanthanide(III) halide or lanthanide(III) borohydride with ligand salts in a non-coordinating solvent, thereby forming a lanthanide-(bis) ligand halide complex or lanthanide-bis(ligand) borohydride complex. This reaction may occur at an elevated temperature, such as a temperature ranging from about 25° C. to about 200° C. The reaction may occur for a time ranging from about 4 hours to about 240 hours. The reaction also occurs in an inert environment, such as a pressure tube or sealed autoclave filled with an inert gas. In an example, the non-coordinating solvent is toluene, benzene, xylene, mesitylene, and other arene solvents that can be used in transmetallation reactions.

In this method 100, an anhydrous lanthanide(III) halide or a lanthanide(III) borohydride ($Ln(BH_4)_3L$ (L=$Et_2O$, $SMe_2$) is used in the initial step 102. The anhydrous lanthanide(III) halide has the formula $LnX_3$, where X is Cl, Br, or I. In some examples, any cationic lanthanide metal may be used. In another example, the cationic lanthanide may be selected from the group consisting of dysprosium (III), yttrium (III), terbium (III), lanthanum (III), cerium (III), Praseodymium (III), neodymium (III), promethium (III), samarium (III), europium (III), gadolinium (III), holmium (III), erbium (III), thulium (III), ytterbium (III), lutetium(III), or combinations thereof. The anhydrous lanthanide halide may be produced using any known methods.

There are two ligands that bond to each cationic lanthanide metal. Prior to bonding to the lanthanide metal, the ligand salts may include any known cations, such as lithium, sodium, or potassium. Some examples of the ligand include an anionic carbon ring ligand, an anionic ligand, and combinations thereof. In particular, some examples of the anionic carbon ring ligand include cyclopentadienyl $(C_5R_5)^-$, cyclononatetraenyl $(C_9R_9)^-$, a carbon ring ligand containing heteroatoms $(C_4R_4P)^-$, cyclobutadienyl $(C_4R_4)_2{}^-$, cycloheptatrienyl $(C_7R_7)^{3-}$, cyclooctatetraenyl $(C_8R_8)^{2-}$, and combinations thereof where R is a hydrogen, a branched or linear alkyl group, a phenyl group, or a branched or linear silyl group where the amount of carbons is equal to or less than 12. Some specific examples of anionic monodentate or polydentate ligands include oxo (—O), nitrido (—N), alkoxide (—OR), amide (—$NR_2$), sulfide (—SR), phosphide (—$PR_2$), imide (—NR), alkyl (—$CR_3$), alkylidene (—$CR_2$), and combinations thereof where R is a hydrogen, a branched or linear alkyl group, a phenyl group, or a branched or linear silyl group where the amount of carbons is equal to or less than 12.

In a specific example, the cyclopentadienyl ligand salt may be used. The cyclopentadienyl salt is a sterically demanding cyclopentadienyl ligand. The sodium salt of the cyclopentadienyl ligand may be present in the reaction in an amount ranging from about 2.0 equivalent to about 3.0 equivalent of the amount of the anhydrous lanthanide halide used in the reaction. In an example, the general structure of the cyclopentadienyl ligand salt is shown below in the structure (I):

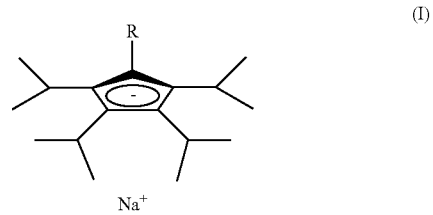

(I)

where R is a hydrogen, a methyl group, an ethyl group, an isopropyl group, an alkyl group, or an aromatic group. In another example, the ligand may be a mixture of different types of cyclopentadienyl ligands (i.e., with a different R groups bound to each cyclopentadienyl molecule). In some examples, the cyclopentadienyl ligand salt is a mixed species containing cyclopentadienyl ligand salts and another ligand, such as a sterically hindered amide or alkoxide ligand.

Figure 2:
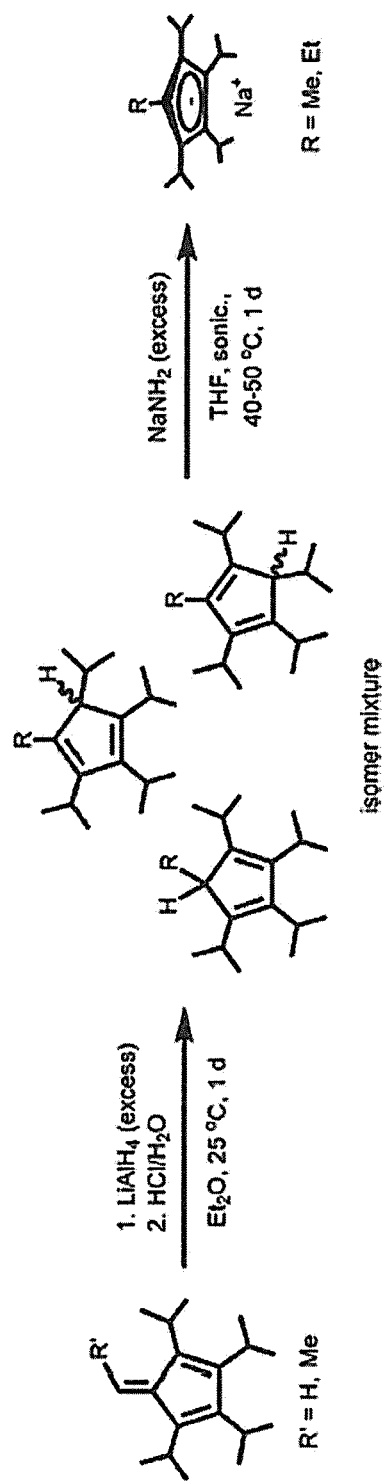
FIG. 2 is a scheme illustrating an example of a method for making a cyclopentadienyl ligand used in the method for making a molecular complex described herein.

In an example, the cyclopentadienyl ligand salt may be prepared from fulvenes. FIG. 2 shows an example of the cyclopentadienyl ligand synthesis. In FIG. 2, a tetraisopropylfulvene is mixed with LiAlH$_4$ and diethyl ether to produce a mixture of cyclopentadienyl lithium salts. The mixture is then neutralized with dilute HCl. The organic fraction is then evaporated to leave a residue containing the isomer mixture shown in FIG. 2. The isomer mixture is mixed with tetrahydrofuran and NaNH$_2$, sonicated overnight, filtered, washed, and dried under vacuum to produce the sodium salt of the cyclopentadienyl ligand used in the method 100 of FIG. 1. In FIG. 2, R is shown as a methyl or ethyl group. However, R may be a hydrogen, a methyl group, an ethyl group, an isopropyl group, an alkyl group, or an aromatic group as previously mentioned herein.

Figure 3:
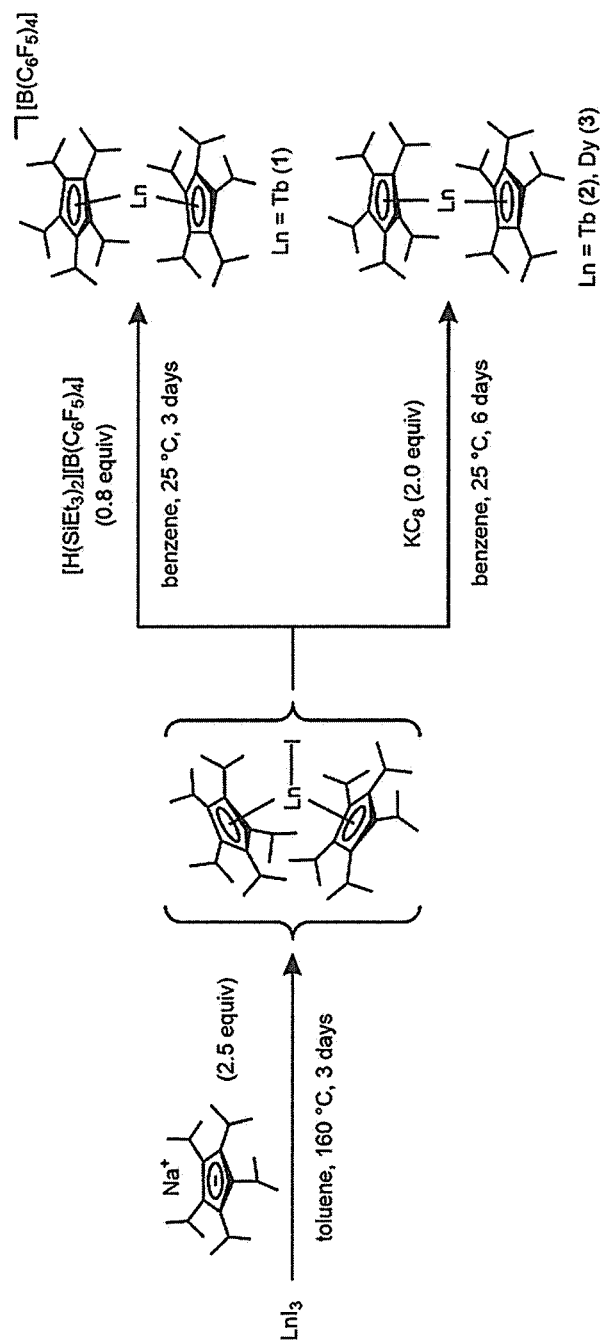
FIG. 3 is a scheme illustrating an example of the method for making a molecular complex described herein.

An example of the reaction in 102 is shown in the first reaction of FIG. 3. The reaction creates an unpurified lanthanide-(bis)cyclopentadienyl iodide complex. The R group in the lanthanide-(bis)cyclopentadienyl iodide complex may be a hydrogen, a methyl group, an ethyl group, an isopropyl group, an alkyl group, an aromatic group, or a combination thereof. The lanthanide-(bis)cyclopentadienyl halide complex is an example of an intermediate molecule that is the precursor to the final molecular complex that is formed in the method 100. The lanthanide-(bis)cyclopentadienyl halide complex formed is shown below with the general structure (II):

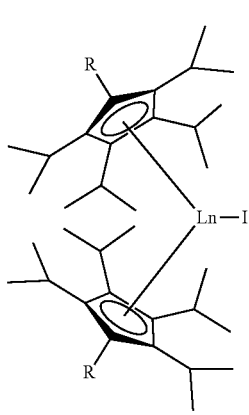

(II)

where the R groups are a hydrogen, a methyl group, an ethyl group, an isopropyl group, an alkyl group, an aromatic group, or a combination thereof. In some examples, any lanthanide metal may be used. In another example, the lanthanide (Ln) may be any lanthanide previously discussed herein. In another example, the lanthanide-(bis)cyclopentadienyl halide complex may have different R groups on a single molecule (e.g., an ethyl group and an isopropyl group in structure (II)). In yet another example, the lanthanide-(bis)cyclopentadienyl halide complex may have different R groups at each ring position (e.g., a structure (II) molecule with all isopropyl groups on one ring and all methyl groups on the other ring). In the structure (II), the anion may also be F, Cl, or Br.

Referring back to FIG. 1, 104 of the method 100 includes isolating the lanthanide-(bis)ligand halide complex or the lanthanide-bis(ligand) borohydride complex. In an example, isolating the lanthanide-(bis)ligand halide complex or the lanthanide-bis(ligand) borohydride complex includes filtration and solvent removal. In another example, isolating the lanthanide-(bis)ligand halide complex or the lanthanide-bis (ligand) borohydride complex includes filtration, solvent removal, and crystallization. Any method may be used to remove the solvent, such as removing the solvent under vacuum. In an example, the solvent may be removed under vacuum to produce a residue, which is heated to 50° C. under vacuum, filtered, and washed to isolate the lanthanide-(bis)ligand halide complex or the lanthanide-bis(ligand) borohydride complex.

For the reaction 106 shown in FIG. 1, the method 100 includes reacting the lanthanide-(bis)ligand halide complex or the lanthanide-bis(ligand) borohydride complex with a halide or hydride abstraction reagent containing a non-coordinating anion, thereby forming a cationic lanthanide-bis(ligand) complex with the non-coordinating anion. This reaction may occur for a time ranging from about 2 hours to about 72 hours. In an example, this reaction may occur at a temperature ranging from about 5° C. to about 45° C. in an inert atmosphere similar to step 102 previously mentioned herein. A non-polar solvent may be used in the reaction. The non-polar solvent may be any arene previously mentioned herein for step 102 or an alkane (e.g., hexane, pentane, etc.).

The halide or hydride abstraction reagent is used to convert the lanthanide-(bis)ligand halide complex to the cationic lanthanide-bis(ligand) complex with the non-coordinating anion. The halide abstraction reagent may be produced using any known methods. Some examples of the halide or hydride abstraction reagent include: [H(SiEt$_3$)$_2$][B(C$_6$F$_5$)$_4$], [H(SiEt$_3$)$_2$]$_2$[B$_{12}$Cl$_{12}$], [H(SiEt$_3$)$_2$][Al(OR$^F$)($-$OR$^F$=perfluoro(tert)butoxide). In an example, when the halide abstraction reagent is [H(SiEt$_3$)$_2$][B(C$_6$F$_5$)$_4$], the halide abstraction reagent may be present in an amount of about 1.0 equivalent or less than the amount of the lanthanide-(bis)ligand halide complex or the lanthanide-bis(ligand) borohydride complex used in the reaction.

The halide abstraction reagent includes a non-coordinating anion that replaces the halide in the lanthanide-(bis) ligand halide complex to form a salt. In this example, the non-coordinating anion may be tetra(pentafluorophenyl)borane (i.e., [B(C$_6$F$_5$)$_4$]$^-$), a borate cluster anion ([B$_{12}$Cl$_{12}$]$^{2-}$), a perfluoroaluminate (e.g., Al(OR$^F$)$_4$($-$OR$^F$=perfluoro (tert)butoxide), and combinations thereof.

FIG. 3 shows one example of 106 in the second reaction. In the example, the lanthanide-(bis)cyclopentadienyl halide complex reacts with [H(SiEt$_3$)$_2$][B(C$_6$F$_5$)$_4$] (the halide abstraction reagent) to produce a lanthanide-(bis)cyclopentadienyl salt. In this example, the lanthanide is dysprosium (III) and the R groups are isopropyl groups.

Referring back to FIG. 1, 108 of the method 100 includes purifying the lanthanide-(bis)ligand complex with a non-coordinating anion, thereby forming the cationic molecular complex where the total charge is +1. The purification 108 may occur at a temperature ranging from about −35° C. to about 110° C. for a time ranging from about 2 hours to about 72 hours. In an example, the crude lanthanide-(bis)ligand complex is purified by dissolving the lanthanide-(bis)ligand complex in a halogenated solvent, such as methylene chloride, and layering with a non-polar solvent. The non-polar solvent may be pentane, hexanes, or combinations thereof. After crystallization, the pure product (i.e., the molecular complex) is washed with non-polar solvents, such as benzene and pentane.

The method 100 produces a cationic molecular complex with a total charge of +1. In an example, the cationic molecular complex may be a lanthanide-(bis)ligand cation with the general structure of [Ln(L)$_2$]$^+$. In one example, Ln is any cationic lanthanide. In another example, Ln may be dysprosium (III), yttrium (III), terbium (III), lanthanum (III), cerium (III), praseodymium (III), neodymium (III), promethium (III), samarium (III), europium (III), gadolinium (III), holmium (III), erbium (III), thulium (III), ytterbium (III), lutetium(III), or combinations thereof. The ligands (L) may be anionic carbon ring ligand, an anionic monodentate or polydentate ligand, and combinations thereof. In particular, some examples of the anionic carbon ring ligands include cyclopentadienyl $(C_5R_5)^-$, cyclononatetraenyl $(C_9R_9)^-$, a carbon ring ligand containing heteroatoms $(C_4R_4P)^-$, cyclobutadienyl $(C_4R_4)^{2-}$, cycloheptatrienyl $(C_7R_7)^3$, cyclooctatetraenyl $(C_8R_8)^{2-}$, and combinations thereof where R is a hydrogen, a branched or linear alkyl group, a phenyl group, or a branched or linear silyl group where the amount of carbons is equal to or less than 12. Some examples of the anionic monodentate or polydentate ligand include oxo (—O), nitrido (—N), alkoxide (—OR), amide (—NR$_2$), sulfide (—SR), phosphide (—PR$_2$), imide (—NR), alkyl (—CR$_3$), alkylidene (—CR$_2$), and combinations thereof where R is a hydrogen, a branched or linear alkyl group, a phenyl group, or a branched or linear silyl group where the amount of carbons is equal to or less than 12 group.

The lanthanide metal may also be a mixture of cationic molecular complexes that include different lanthanide metals previously listed. In another example, the cationic molecular complex may have two different R groups on a single molecule. For example, the cationic molecular complex may have two different anionic carbon ring ligands bonded to a single lanthanide molecule. In yet another example, the cationic molecular complex may have an anionic monodentate or polydentate ligand and an anionic carbon ring ligand on a single lanthanide molecule.

The cationic molecular complexes previously described herein may have a bond angle between the metal and each individual ligand ranging from about 120° to about 180°. The bond distances between the metal and each individual ligand may range from about 2.0 Å to about 3.0 Å.

Second, a method for making an anionic molecular complex with a total charge of −1 is disclosed herein. The method includes reacting an anhydrous lanthanide(III) halide (LnX$_3$) or lanthanide(III) borohydride with ligand salts in a non-coordinating solvent, thereby forming an anionic lanthanide-bis(ligand) complex, isolating the anionic lanthanide-bis(ligand) complex, reacting the anionic lanthanide-bis(ligand) complex with a cation complexing reagent in a solvent, thereby forming an anionic lanthanide-bis(ligand) complex with a non-coordinating cation, and purifying the anionic lanthanide-bis(ligand) complex with a non-coordinating cation, thereby forming the anionic molecular complex with a total charge of −1.

Figure 4:
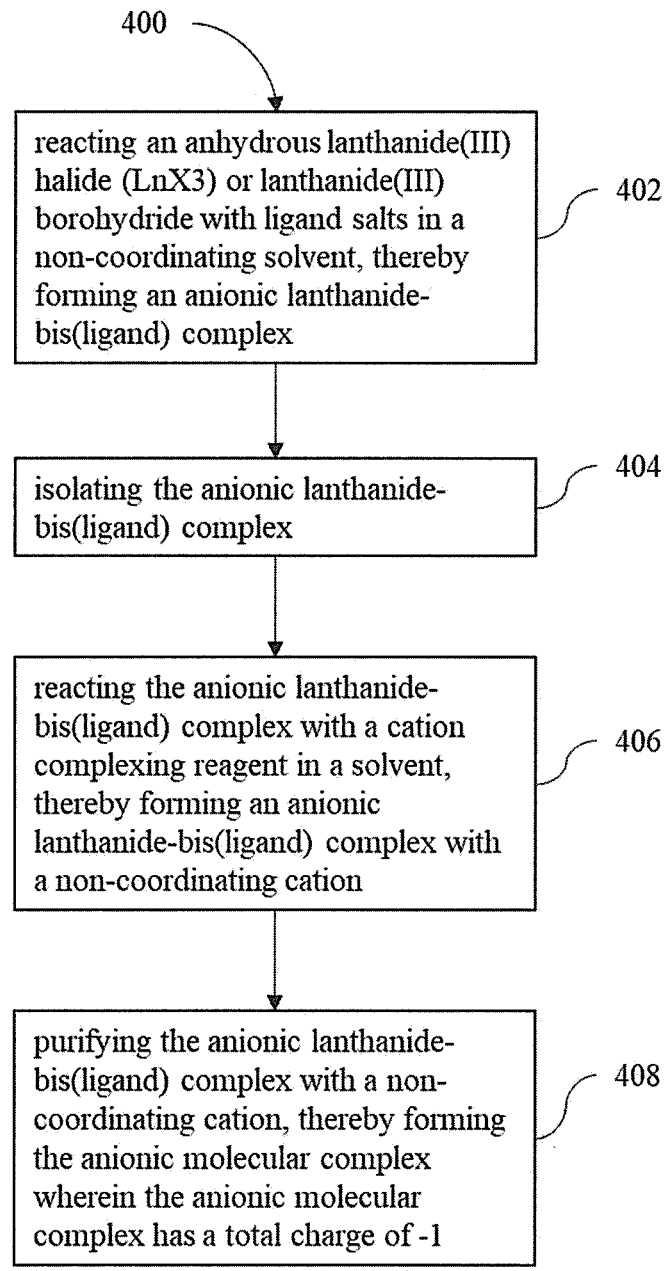
FIG. 4 is a is a flow diagram illustrating another example of a method for making an anionic molecular complex described herein.

Referring now to FIG. 4, the reaction 402 of method 400 includes reacting an anhydrous lanthanide(III) halide (LnX$_3$) or lanthanide(III) borohydride with ligand salts in a non-coordinating solvent, thereby forming an anionic lanthanide-(bis)ligand halide complex. There are two anionic ligands that bond to each individual lanthanide molecule in 402 and the cations are removed prior to the subsequent reaction. This reaction has the same procedures and solvents as previously described herein for the reaction 102 of method 100. However, in 402, a coordinating or non-coordinating solvent may be used in the reaction 102. The non-coordinating solvent may be the same as previously described in 102. Some examples of coordinating solvents include tetrahydrofuran, 1,2-dimethoxyethane, or diethyl ether. Additionally, the same anionic ligands as previously discussed herein for the reaction 102 in method 100 may be used, but the overall ligand charge will be −4.

In this method 400, the anhydrous lanthanide(III) halide is used in the initial 402 reaction. The anhydrous lanthanide (III) halide has the formula LnX$_2$, where X is Cl, Br, or I. In some examples, any cationic lanthanide metal may be used. In another example, the cationic lanthanide may be selected from the group consisting of dysprosium (III), yttrium (III), terbium (III), lanthanum (III), cerium (III), praseodymium (III), neodymium (III), promethium (III), samarium (III), europium (III), gadolinium (III), holmium (III), erbium (III), thulium (III), ytterbium (III), lutetium(III), or combinations thereof. The anhydrous lanthanide halide may be produced using any known methods.

Referring back to FIG. 4, the method 400 includes 404 isolating the anionic lanthanide bis(ligand) complex. The procedure for 404 may be performed as previously described herein for 104 in method 100 using the same techniques described in 104.

Referring to FIG. 4, the reaction 406 of method 400 includes reacting the anionic lanthanide-bis(ligand) complex with a cation complexing reagent in a solvent, thereby forming an anionic lanthanide-bis(ligand) complex with a non-coordinating cation. This reaction may occur for a time ranging from about 2 hours to about 72 hours. In an example, this reaction may occur at a temperature ranging from about 5° C. to about 45° C. in an inert atmosphere similar to step 102 of method 100 previously discussed herein. A coordinating or non-coordinating solvent may be used in the reaction. The non-coordinating solvent may be any arene previously mentioned herein for step 102 or an alkane (e.g., hexane, pentane, etc.), the coordinating solvent may be tetrahydrofuran, 1,2-dimethoxyethane, diethyl ether or a similar solvent.

The cation complexing reagent produces a non-coordinating cation by sequestering the cation in a molecular complex. Some examples of the cation complexing reagent include 18-crown-6 and [2.2.2]cryptand.

Referring to FIG. 4, the method 400 includes purifying 408 the anionic lanthanide-bis(ligand) complex with a non-coordinating cation, thereby forming the anionic molecular complex. The purification 408 may be the same as previously disclosed herein for the purification 108 in method 100, and may also include crystallization from coordinating solvents previously described herein. After purification 408, the final anionic molecular complex is formed. The non-coordinating cation may be an alkali metal cryptand complex (e.g., [K(222-crypt)]), a crown ether complex, (e.g., ([K(18-crown-6)]), any similar non-coordinating cation, and combinations thereof.

The method 400 produces an anionic molecular complex with a total charge of −1. The anionic molecular complex may have a structure of [Ln(L)$_2$]$^-$. In an example, Ln may be any cationic lanthanide metal. In another example, the lanthanide is selected from the group consisting of dysprosium (III), yttrium (III), terbium (III), lanthanum (III), cerium (III), praseodymium (III), neodymium (III), promethium (III), samarium (III), europium (III), gadolinium (III), holmium (III), erbium (III), thulium (III), ytterbium (III), lutetium(III), or combinations thereof. The ligands (L) may be anionic carbon ring ligands, anionic monodentate or polydentate ligands, and combinations thereof.

In particular, some examples of the anionic carbon ring ligands include cyclopentadienyl $(C_5R_5)^-$, cyclononatetraenyl $(C_9R_9)^-$, a carbon ring ligand containing heteroatoms $(C_4R_4P)^-$, cyclobutadienyl $(C_4R_4)^{2-}$, cycloheptatrienyl $(C_7R_7)^{3-}$, cyclooctatetraenyl $(C_8R_8)^{2-}$, and combinations thereof where R is a hydrogen, a branched or linear alkyl group, a phenyl group, or a branched or linear silyl group where the amount of carbons is equal to or less than 12. Some examples of the anionic monodentate or polydentate ligand include oxo (—O), nitrido (—N), alkoxide (—OR), amide (—NR$_2$), sulfide (—SR), phosphide (—PR$_2$), imide (—NR), alkyl (—CR$_3$), alkylidene (—CR$_2$), and combinations thereof where R is a hydrogen, a branched or linear alkyl group, a phenyl group, or a branched or linear silyl group where the amount of carbons is equal to or less than 12.

In an example, the anionic molecular complex may have different ligands bonded to a single lanthanide metal. For example, the anionic molecular complex may have two different anionic ligands bonded to a single lanthanide metal. In yet another example, the anionic molecular complex may have anionic monodentate or polydentate ligand and an anionic carbon ring ligand bonded to the lanthanide metal.

The anionic molecular complexes may have bond angles between the metal and each individual ligand ranging from about 120° to about 180°. The bond distances between the metal and each individual ligand may range from about 2.0 Å to about 3.0 Å.

Third, a method for making a molecular complex with a total charge of 0 is disclosed herein. The method includes reacting an anhydrous lanthanide(III) halide (LnX3), lanthanide(II) halide (LnX$_2$) or lanthanide(III) borohydride with ligand salts in a non-coordinating solvent, thereby forming a lanthanide-bis(ligand) halide complex, lanthanide-bis(ligand) borohydride complex, neutral trivalent lanthanide-bis(ligand) complex or a neutral divalent lanthanide-bis(ligand) complex, isolating the lanthanide-bis(ligand) halide complex, neutral trivalent lanthanide-bis(ligand) complex, the lanthanide-bis(ligand) borohydride complex, or the neutral divalent lanthanide-bis(ligand) complex, and either reacting the lanthanide-bis(ligand) halide complex or lanthanide-bis(ligand) borohydride complex with a reducing agent, thereby forming a neutral divalent lanthanide-bis(ligand) complex and purifying the neutral divalent lanthanide-bis(ligand) complex, thereby forming the molecular complex with a total charge of 0 or purifying the neutral trivalent lanthanide-bis(ligand) complex or the neutral divalent lanthanide-bis(ligand) complex, thereby forming the molecular complex with a total charge of 0.

Figure 5:
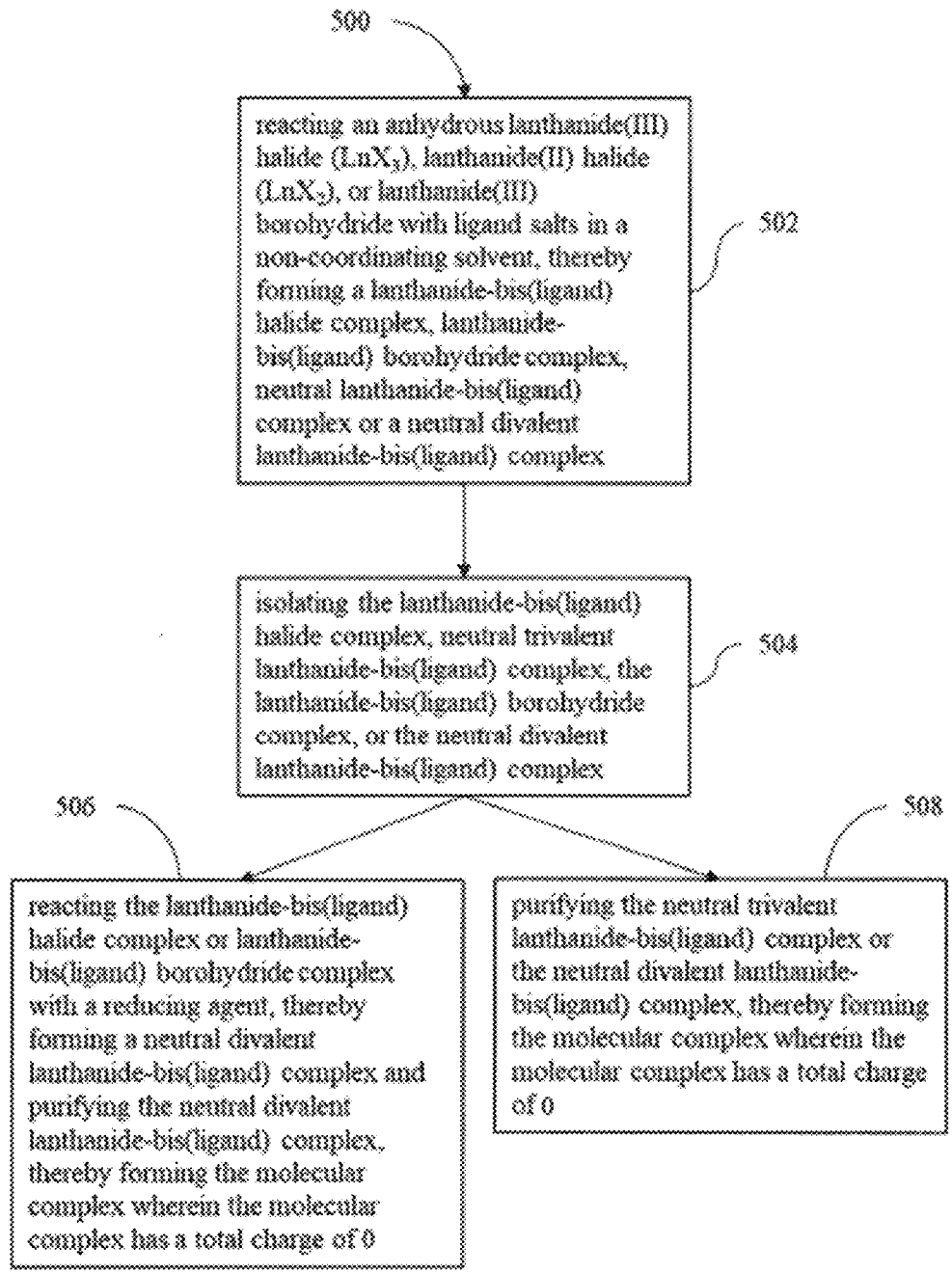
FIG. 5 is a is a flow diagram illustrating another example of a method for making a molecular complex described herein.

Referring now to FIG. 5, the method 500 includes 502 reacting an anhydrous lanthanide(III) halide (LnX$_3$), lanthanide(II) halide (LnX$_2$), or lanthanide(III) borohydride with ligand salts, in a non-coordinating solvent, thereby forming a lanthanide-bis(ligand) halide complex, lanthanide-bis(ligand) borohydride complex, neutral trivalent lanthanide-bis(ligand) complex or a neutral divalent lanthanide-bis(ligand) complex. There are two anionic ligands that bond to each individual lanthanide molecule in 502 and the cations are removed prior to the subsequent reaction. This reaction has the same procedures and solvents as previously described herein for the reaction 102 of method 100. Additionally, the same anionic ligands as previously discussed herein for the reaction 102 in method 100 may be used. Similar to reaction 102, the same intermediate product shown in FIG. 3 and previously discussed herein may be produced as the lanthanide-(bis)ligand halide complex. The neutral trivalent lanthanide-bis(ligand) complex and the neutral divalent lanthanide-bis(ligand) complex have no associated anion (e.g., halide).

Referring to FIG. 5, the method 500 includes 504 isolating the lanthanide-bis(ligand) halide complex, neutral trivalent lanthanide-bis(ligand) complex, the lanthanide-bis(ligand) borohydride complex, or the neutral divalent lanthanide-bis(ligand) complex. The procedure for 504 may be performed as previously described herein for 104 in method 100 using the same techniques described in 104.

Referring now to FIG. 5, the method 500 has two separate potential procedures depending on the product that is isolated in 504. When the lanthanide-bis(ligand) halide complex or the lanthanide-bis(ligand) borohydride complex is isolated in 504, the method 500 includes 506 reacting the lanthanide-bis(ligand) halide complex or lanthanide-bis(ligand) borohydride complex with a reducing agent, thereby forming a neutral divalent lanthanide-bis(ligand) complex and purifying the neutral divalent lanthanide-bis(ligand) complex, thereby forming the molecular complex with a total charge of 0. The reaction with the reducing agent may occur for a time ranging from about 2 hours to about 72 hours. In an example, this reaction may occur at a temperature ranging from about 5° C. to about 45° C. in an inert atmosphere similar to step 102 previously mentioned herein. A non-polar solvent may be used in the reaction. The non-polar solvent may be any arene previously mentioned herein for step 102 or an alkane (e.g., hexane, pentane, etc.). The purification may be conducted as previously described herein for 108 in method 100, or may involve recrystallization in an alkane solvent, such as hexane or pentane.

The reducing agent removes the halide from the lanthanide-bis(ligand) halide complex or lanthanide-bis(ligand) borohydride complex. Some examples of the reducing agent include KC$_8$, potassium metal, sodium metal, lithium metal, potassium/sodium alloy (NaK) or sodium/mercury amalgam. When the reducing agent is KC$_8$, the reducing reagent may be present in an amount ranging from about 1.0 equivalent to about 4.0 equivalent of the amount of the lanthanide-(bis)ligand halide complex used in the reaction. In an example, a lanthanide-(bis)cyclopentadienyl halide complex reacts with potassium graphite (KC$_8$) as the reducing agent to produce a neutral divalent lanthanide metallocene. When the reducing reagent is used, the halide or borohydride is removed as an alkali metal salt to form an unpurified neutral molecular complex. Once the purification is complete, the final neutral molecular complex is formed.

Referring back to FIG. 5, in another example, when neutral trivalent lanthanide-bis(ligand) complex or the neutral divalent lanthanide-bis(ligand) complex is isolated in 504, the method 500 includes purifying 508 purifying the neutral trivalent lanthanide-bis(ligand) complex or the neutral divalent lanthanide-bis(ligand) complex, thereby forming the neutral molecular complex. The purification may be conducted as previously described herein for 108 in method 100, or may involve recrystallization in an alkane solvent, such as hexane or pentane. Similar to 506, there is no non-coordinating anion associated with the neutral lanthanide-bis(ligand) complex or the neutral divalent lanthanide-bis(ligand) complex. Additionally, no associated molecules are removed since the molecules being purified are already neutral. Once 508 is complete, the final molecular complex is formed with a total charge of 0.

The molecular complex with a total charge of 0 may have a structure of [Ln(L)$_2$]. In an example, Ln may be any cationic lanthanide metal with charge of +3 or +2. In another example, the cationic lanthanide metal is selected from the group consisting of dysprosium (III), yttrium (III), terbium (III), lanthanum (III), cerium (III), Praseodymium (III), neodymium (III), promethium (III), samarium (III), europium (III), gadolinium (III), holmium (III), erbium (III), thulium (III), ytterbium (III), lutetium(III), dysprosium (II), yttrium (II), terbium (II), lanthanum (II), cerium (II), Praseodymium (II), neodymium (II), promethium (II), samarium (II), europium (II), gadolinium (II), holmium (II), erbium (II), thulium (II), ytterbium (II), lutetium(II) and combinations thereof.

The ligands may be anionic carbon ring ligands, anionic monodentate or polydentate ligands, and combinations thereof. In particular, some examples of the anionic carbon ring ligands include cyclopentadienyl $(C_5R_5)^-$, cyclononatetraenyl $(C_9R_9)^-$, a carbon ring ligand containing heteroatoms $(C_4R_4P)^-$, cyclobutadienyl $(C_4R_4)^{2-}$, cycloheptatrienyl $(C_7R_7)^{3-}$, cyclooctatetraenyl $(C_8R_8)^{2-}$, and combinations thereof where R is a hydrogen, a branched or linear alkyl group, a phenyl group, or a branched or linear silyl group where the amount of carbons is equal to or less than 12. Some examples of the anionic monodentate or polydentate ligand include oxo (–O), nitrido (—N), alkoxide (—OR), amide (—$NR_2$), sulfide (—SR), phosphide (—$PR_2$), imide (—NR), alkyl (—$CR_3$), alkylidene (—$CR_2$), and combinations thereof where R is a hydrogen, a branched or linear alkyl group, a phenyl group, or a branched or linear silyl group where the amount of carbons is equal to or less than 12.

In an example, the neutral molecular complex may have different ligands bonded to a single lanthanide metal. For example, the neutral molecular complex may have two different anionic ligands bonded to a single lanthanide metal. In yet another example, the neutral molecular complex may have an anionic monodentate or polydentate ligand and an anionic carbon ring ligand bonded to the lanthanide metal.

The molecular complexes with a total charge of 0 may have a bond angle between the metal and each individual ligand ranging from about 120° to about 180°. The bond distances between the metal and each individual ligand may range from about 2.0 Å to about 3.0 Å.

In some examples, the methods 100, 400, or 500 may further include dissolving the molecular complexes in any suitable solvent and depositing the molecular complexes onto a substrate. The molecular complexes may be deposited onto a substrate using known techniques, such as spin casting, dip casting, vapor phase deposition, and dip coating. In another example, the molecular complexes with a total charge of 0 are deposited via sublimation at a reduced pressure as an ordered array of molecules using a grid or mask. In yet another example, the molecular complexes are dispersed within a polymeric or inorganic matrix.

To further illustrate the present disclosure, examples are given herein. These examples are provided for illustrative purposes and are not to be construed as limiting the scope of the present disclosure.

EXAMPLES

All manipulations were performed using Schlenk or glovebox techniques under an atmosphere of purified argon with rigorous exclusion of water and oxygen. All solvents were purged for several hours with purified argon and stored over activated 3 Å molecular sieves in an argon filled glovebox. The halide abstraction reagent, $[H(SiEt_3)_2][B(C_6F_5)_4]$, was prepared before use. The salt $NaCp^{iPr4}$ was synthesized using known methods and dried under vacuum to remove traces of THF. Tetraisopropylfulvene and methyl-substituted tetraisopropylfulvene were prepared using known methods and recrystallized several times from anhydrous ethanol at −70° C. The obtained fulvenes were assayed via GC-MS, and purities of 86% and 85% were found for tetraisopropylfulvene and methylsubstituted tetraisopropyl-fulvene, respectively. The main impurity in both cases was a mixture of tetraisopropylcyclopentadiene isomers.

The salt $NaCp^{iPr5}$ was obtained from methyl-substituted tetraisopropylfulvene in two steps via a combination of known methods. Methyl-substituted tetraisopropylfulvene was initially converted to the Li+ salt of pentaisopropylcyclopentadiene using a known method and hydrolyzed in situ by careful addition of $H_2O$ to give free pentaisopropylcyclopentadiene after extraction into $Et_2O$ and solvent removal. The resulting compound was deprotonated using excess $NaNH_2$ (1.2 equiv.) in refluxing THF with the aid of sonication via a known method. The salt $NaCp^{iPr5}$ was extracted from the crude material (mostly a mixture of $NaCp^{iPr4}$ and $NaCp^{iPr5}$) with benzene and the solvent removed under vacuum. The off-white solid was dried under vacuum at 100° C. for 2 hours to remove coordinated THF, washed with pentane, and dried under vacuum at room temperature to give pure $NaCp^{iPr5}$ as a white powder.

GC-MS experiments were performed using a Thermo Scientific Exactive GC-MS (Orbitrap) with a Thermo Scientific Trace 1310 GC using a TG-5SILMS column. NMR spectra were recorded on a Bruker Avance 300 MHz or 500 MHz spectrometer and internally referenced to the residual solvent signals. FT-IR spectra were recorded on a Perkin Elmer Avatar Spectrum 400 FTIR Spectrometer equipped with an attenuated total reflectance (ATR) attachment.

Elemental analyses (C, H, N) were performed using a Perkin-Elmer 2400 Series II combustion analyzer. Metals analyses (Dy, Y) were performed on a Thermo Fisher Scientific iCAP 6300 Inductively Coupled Plasma-Atomic Emission Spectrometer (ICP-AES). Magnetic susceptibility measurements were collected using a Quantum Design MPMS2 SQUID magnetometer.

Example 1: Synthesis of $NaCp^{iPr4Me}$

Tetraisopropylfulvene (1.00 g, 4.05 mmol) (86% pure by GC-MS) and $Et_2O$ (40 mL) were combined in a 100 mL Schlenk flask to produce a bright orange solution. The solution was cooled to 0° C. and 1.0 M $LiAlH_4$ in $Et_2O$ (12.1 mL, 12.1 mmol) was added all at once via syringe. The reaction flask was allowed to warm to room temperature and stirred for 20 hours. At this point, the initial orange solution had been replaced with a grayish suspension and solvent was removed under vacuum to leave a grayish residue. This residue was slurried in 30 mL pentane for 30 minutes, filtered and washed with 2×15 mL pentane to leave a white/gray powder. The powder was taken up in 50 mL of $Et_2O$, cooled to 0° C., and 20 mL of $H_2O$ was added, followed by 20 mL of 1.0 M HCl. This mixture was stirred vigorously for 30 minutes and then the layers were separated. The aqueous layer was extracted with 2×50 mL of $Et_2O$ and the combined organic fractions were washed with 25 mL of brine, dried with $MgSO_4$, and the solvent was removed under vacuum to leave a light yellow oil (0.70 g, 2.8 mmol of $HCp^{iPr4Me}$ tautomers).

Figure 16A:
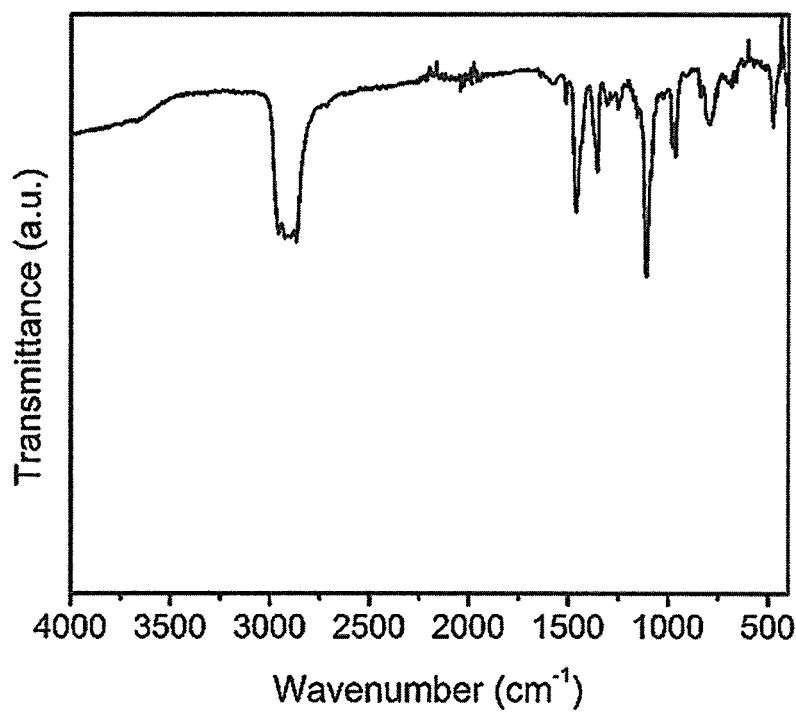
FIG. 16A-FIG. 16B are plots of the wavenumber (X-axis, labeled "Wavenumber cm$^{-1}$") vs. the transmittance (Y-axis, labeled "Transmittance (a.u.)") of different cyclopentadienyl ligands described herein.

The yellow oil was combined with $NaNH_2$ (0.22 g, 5.60 mmol) and 20 mL of THF in a 50 mL Schlenk flask equipped with a reflux condenser. The reaction flask was immersed in a sonication bath filled with $H_2O$ at a temperature ranging from 40° C. to 50° C. and sonicated overnight under argon. The flask was subsequently cooled to room temperature and the solvent was removed under vacuum to leave a beige residue. This residue was transferred to an Ar-filled glovebox, re-suspended in 25 mL of THF, filtered through Celite, and the filter cake was then washed with additional THF to give an amber filtrate. The solvent was removed from the filtrate under vacuum and the resulting off-white solid heated under vacuum at 100° C. for 2 hours to remove coordinated THF. This solid was then slurried in 25 mL pentane, filtered, washed with additional pentane, and dried under vacuum at room temperature to give pure NaCp$^{iPr4Me}$ as a white powder (0.59 g, 54% yield based on tetraisopropylfulvene). $^1$H NMR (THF-d$_8$, 500 MHz, 338 K): δ=1.24 (d, 12H, Cp-CH(CH$_3$)$_2$), 1.25 (d, 12H, Cp-CH(CH$_3$)$_2$), 2.19 (s, 3H, Cp-CH$_3$), 3.19 (m, 4H, Cp-CH(CH$_3$)$_2$). $^{13}$C{$^1$H} NMR (THF-d$_8$, 125 MHz, 338 K): δ=15.00 (Cp-CH$_3$), 25.37 (Cp-CH(CH$_3$)$_2$), 26.19 (Cp-CH(CH$_3$)$_2$), 28.21 (Cp-CH(CH$_3$)$_2$), 28.32 (Cp-CH(CH$_3$)$_2$), 104.78 (—C(iPr)—C(Me)-C(iPr)—), 116.60 (—C(iPr)—C(iPr)—C(iPr)—), 118.53 (—C(Me)-C(iPr)—C(iPr)—). Calculated for C$_{18}$H$_{31}$Na (270.44) (%): C, 79.94, H, 11.55; found (%): C, 77.94, H, 10.32. More characterization data are shown in FIG. 16A, FIGS. 17A, and 17B.

Example 2: Synthesis of NaCp$^{iPr4Et}$

Figure 16B:
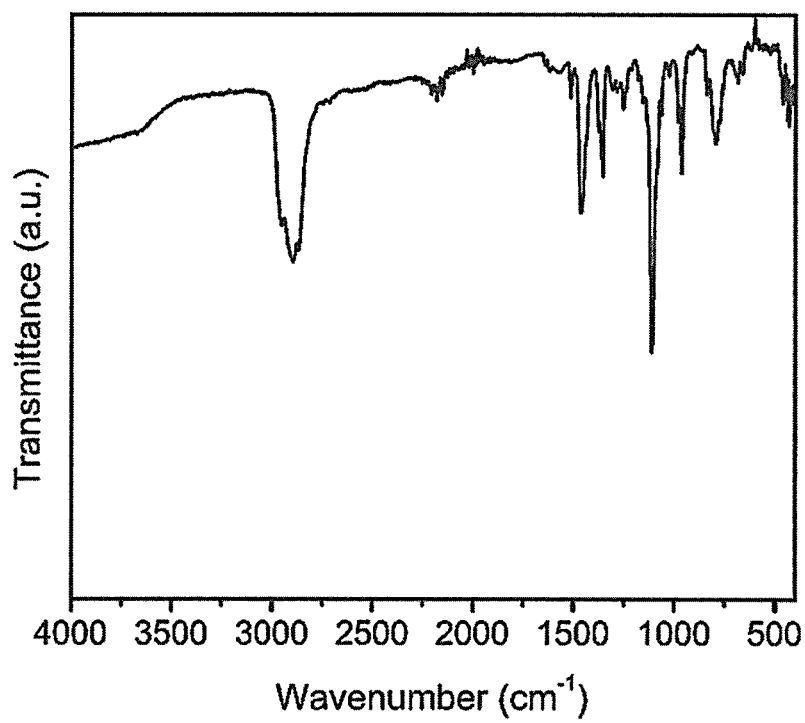

Following the general procedure outlined in Example 1 (the quantity of all solvents was doubled), NaCp$^{iPr4Et}$ was synthesized from methyl-substituted tetraisopropylfulvene (3.00 g, 11.5 mmol) (85% pure by GC-MS) and 1.0 M LiAlH$_4$ in Et$_2$O (34.4 mL, 34.4 mmol) to initially give a light yellow oil after quenching with H$_2$O (40 mL) and 1.0 M HCl (40 mL) (2.1 g, 8.0 mmol of HCp$^{iPr4Et}$ tautomers). This was deprotonated in the same fashion as Example 1 using NaNH$_2$ (0.62 g, 16 mmol). Pure NaCp$^{iPr4Et}$ was isolated as a white powder (2.05 g, 63% yield based on methyl substituted tetraisopropylfulvene). $^1$H NMR (THF-d$_8$, 500 MHz, 338 K): δ=1.02 (t, 3H, Cp-CH$_2$CH$_3$), 1.25 (d, 12H, Cp-CH(CH$_3$)$_2$), 1.26 (d, 12H, Cp-CH(CH$_3$)$_2$), 2.56 (q, 2H, Cp-CH$_2$CH$_3$), 3.14 (br, 2H, Cp-CH(CH$_3$)$_2$), 3.26 (sept, 2H, Cp-CH(CH$_3$)$_2$). $^{13}$C{$^1$H} NMR (THF-d8, 125 MHz, 338 K): δ=19.79 (Cp-CH$_2$CH$_3$), 21.78 (Cp-CH$_2$CH$_3$), 25.78 (Cp-CH(CH$_3$)$_2$), 26.12 (Cp-CH(CH$_3$)$_2$), 28.14 (br, Cp-CH(CH$_3$)$_2$), 28.51 (Cp-CH(CH$_3$)$_2$), 112.76 (—C(iPr)—C(Et)-C(iPr)—), 116.89 (—C(iPr)—C(iPr)—C(iPr)—), 117.79 (—C(Et)-C(iPr)—C(iPr)—). Calculated for C$_{19}$H$_{33}$Na (284.46) (%): C, 80.22, H, 11.69; found (%): C, 79.91, H, 11.66. More characterization data are shown in FIG. 16B, FIG. 17C, and FIG. 17D.

Example 3: Synthesis of [Dy(Cp$^{iPr5}$)$_2$][B(C$_6$F$_8$)$_4$]

DyI$_3$ (0.24 g, 0.44 mmol) and NaCp$^{iPr5}$ (0.33 g, 1.10 mmol) were combined in a 35 mL pressure flask containing a glass-coated magnetic stirring bar. Toluene (15 mL) was then added, and the reaction flask was covered in Al foil and heated gradually to 160° C. with vigorous stirring. After 72 hours at 160° C., the flask was allowed to cool to room temperature, the reaction mixture was filtered through Celite, and the pad was washed with additional toluene (3×5 mL). Solvent was removed from the filtrate under vacuum and the residue was then gently heated (50° C.) under vacuum for 1 hour. The residue was taken up in pentane (25 mL), stirred for 0.5 hours, filtered through Celite, and the pad washed with additional pentane (3×5 mL). Solvent was removed from the filtrate under vacuum and the residue was then gently heated (50° C.) under vacuum for 0.5 hours to give crude Dy(Cp$^{iPr5}$)$_2$I.

Figure 14A:
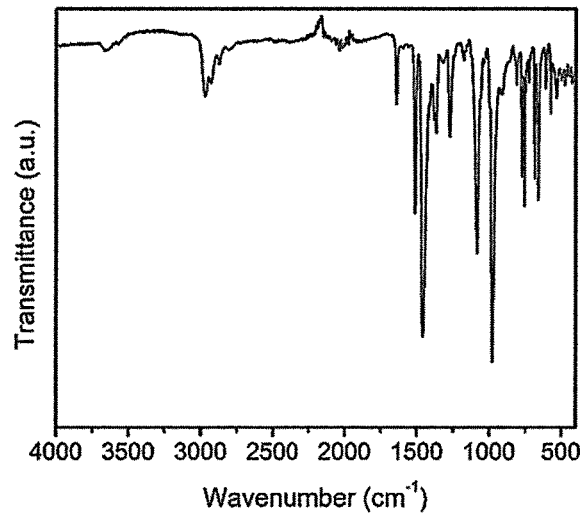
FIG. 14A-FIG. 14D are plots of the wavenumber (X-axis, labeled "Wavenumber cm$^{-1}$") vs. the transmittance (Y-axis, labeled "Transmittance (a.u.)") of different molecular complex examples described herein.
Figure 14B:
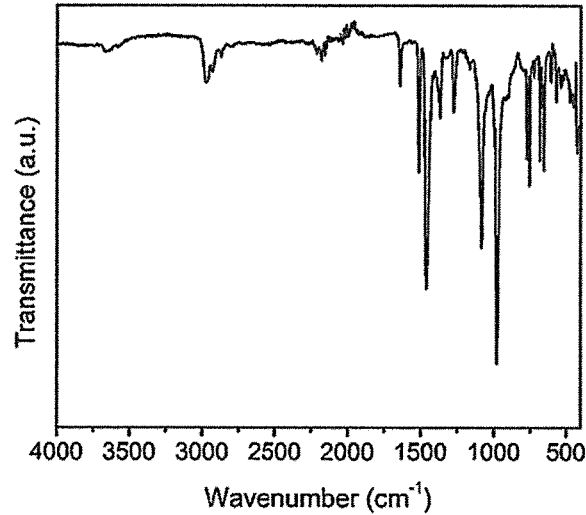
Figure 14C:
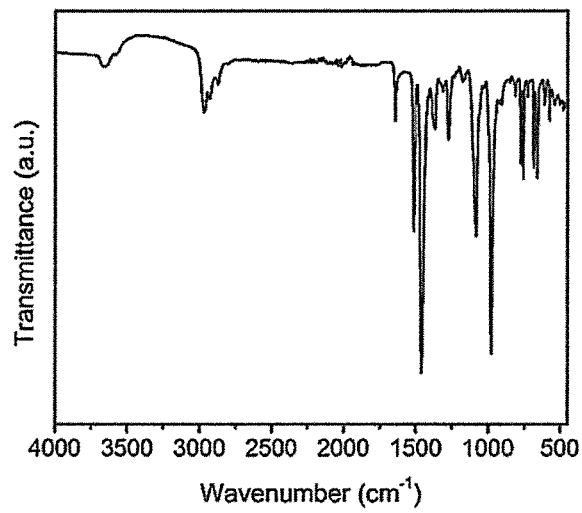
Figure 14D:
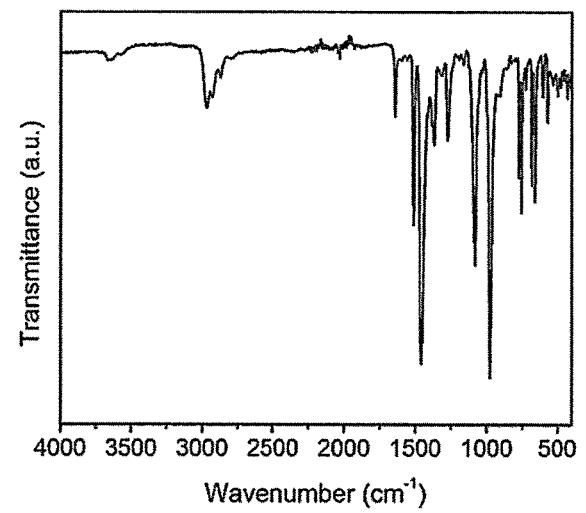

The crude Dy(Cp$^{iPr5}$)$_2$I was dissolved with benzene (10 mL) in a 25 mL Schlenk flask equipped with a Teflon-coated magnetic stirring bar. Under vigorous stirring at room temperature, a solution of [H(SiEt$_3$)$_2$][B(C$_6$F$_5$)$_4$] (0.36 g, 0.39 mmol) in benzene (5 mL) was added dropwise to the Dy(Cp$^{iPr5}$)$_2$I solution over 5 minutes. After stirring for 72 hours at room temperature, solvent was removed from the reaction mixture under vacuum. The residue was then slurried with pentane (20 mL) for 0.5 hours to yield a powder which was collected on a medium-porosity fritted filter and washed with pentane (3×10 mL). This solid was dried under vacuum, dissolved in dichloromethane (4 mL), filtered with the aid of Celite through a 0.2 mm porosity PTFE syringe filter, and layered with pentane (15 mL) in a 20 mL vial. After 48 hours at room temperature, well-formed crystals were obtained, isolated on a medium-porosity fritted filter, and washed consecutively with pentane (5 mL), benzene (2×5 mL) and pentane (5 mL). The crystallization was repeated and the twice recrystallized solid was dried under vacuum to yield [Dy(Cp$^{iPr5}$)$_2$][B(C$_6$F$_5$)$_4$] as orange needles (0.35 g, 57% yield based on DyI$_3$). Calculated for C$_{64}$H$_{70}$BF$_{20}$Dy (1392.54) (%): C, 55.20, H, 5.07, Dy, 11.7; found (%): C, 55.21, H, 4.80, Dy, 11.3 (For [Dy(Cp$^{iPr5}$)$_2$][B(C$_6$F$_5$)$_4$], a 3$^{rd}$ recrystallization was needed to obtain acceptable values). More characterization data are shown in FIG. 14D.

Example 4: Synthesis of [Dy(Cp$^{iPr4}$)$_2$][B(C$_6$F$_5$)$_4$]

The same general procedure used for Example 3 was used to for the synthesis of [Dy(Cp$^{iPr4}$)$_2$][B(C$_6$F$_5$)$_4$]. [Dy(Cp$^{iPr4}$)$_2$][B(C$_6$F$_5$)$_4$] was synthesized from DyI$_3$ (0.21 g, 0.39 mmol), NaCp$^{iPr4}$ (0.25 g, 0.98 mmol) and [H(SiEt$_3$)$_2$][B(C$_6$F$_5$)$_4$] (0.28 g, 0.31 mmol). Subsequent crystallizations were carried out over 24 hours at room temperature and 24 hours at −35° C. [Dy(Cp$^{iPr4}$)$_2$][B(C$_6$F$_5$)$_4$] was obtained as yellow prisms (0.21 g, 41% yield based on DyI$_3$). Calculated for C$_{58}$H$_{58}$BF$_{20}$Dy (1308.38) (%): C, 53.24, H, 4.47, Dy, 12.4; found (%): C, 52.88, H, 4.45, Dy, 12.8. More characterization data are shown in FIG. 14A.

Example 5: Synthesis of [Dy(Cp$^{iPr4Me}$)$_2$][B(C$_6$F$_5$)$_4$]

The same general procedure used for Example 3 was used to for the synthesis of [Dy(Cp$^{iPr4Me}$)$_2$][B(C$_6$F$_5$)$_4$]. [Dy(Cp$^{iPr4}$Me)$_2$][B(C$_6$F$_5$)$_4$] was synthesized from DyI$_3$ (0.20 g, 0.37 mmol), NaCpiPr4Me (0.25 g, 0.92 mmol) and [H(SiEt$_3$)$_2$][B(C$_6$F$_5$)$_4$] (0.27 g, 0.30 mmol). The first crystallization was conducted at −35° C. and the second at room temperature. [Dy(Cp$^{iPr4Me}$)$_2$][B(C$_6$F$_5$)$_4$] was obtained as orange-yellow prisms (0.25 g, 50% yield based on DyI$_3$). Calculated: C$_{60}$H$_{62}$BF$_{20}$Dy (1336.43) (%): C, 53.92, H, 4.68, Dy, 12.2; found (%): C, 53.36, H, 4.48, Dy, 12.6. More characterization data are shown in FIG. 14B.

Example 6: Synthesis of [Dy(Cp$^{iPr4Et}$)$_2$][B(C$_6$F$_5$)$_4$]

The same general procedure used for Example 3 was used to for the synthesis of [Dy(Cp$^{iPr4Et}$)$_2$][B(C$_6$F$_5$)$_4$]. [Dy(Cp$^{iPr4Et}$)$_2$][B(C$_6$F$_5$)$_4$] was synthesized from DyI$_3$ (0.23 g, 0.42 mmol), NaCp$^{iPr4Et}$ (0.30 g, 1.05 mmol) and [H(SiEt$_3$)$_2$][B(C$_6$F$_5$)$_4$] (0.31 g, 0.34 mmol). Crystallizations were performed in the same manner Example 3. [Dy(Cp$^{iPr4Et}$)$_2$][B(C$_6$F$_5$)$_4$] was obtained as orange-yellow needles (0.31 g, 54% yield based on DyI$_3$). Calculated C$_{62}$H$_{66}$BF$_{20}$Dy (1364.49) (%): C, 54.58, H, 4.88, Dy, 11.9; found (%): C, 54.05, H, 4.68, Dy, 12.1. More characterization data are shown in FIG. 14C.

Example 7: Synthesis of [Tb(Cp$^{iPr5}$)$_2$][B(C$_6$F$_5$)$_4$]

Under argon, TbI$_3$ (0.250 g/0.463 mmol) and NaCp$^{iPr5}$ (0.350 g/1.17 mmol) were combined in a 35 mL pressure flask containing a glass-coated magnetic stirring bar and toluene (15 mL) was added. The reaction flask was covered in Al foil, and heated gradually to 160° C. with vigorous stirring. After 72 hours at 160° C., the flask was allowed to cool to room temperature, the reaction mixture was filtered through Celite and the pad washed with additional toluene (3×5 mL). Solvent was removed from the filtrate under vacuum and the residue was gently heated (50° C.) under vacuum for 1 hour. The residue was taken up in pentane (25 mL), stirred for 0.5 hours, filtered through Celite and the pad washed with additional pentane (3×5 mL). Solvent was removed from the filtrate under vacuum and the residue was gently heated (50° C.) under vacuum for 0.5 hours to give crude Tb(Cp$^{iPr5}$s)$_2$I as a yellow powder.

Figure 11A:
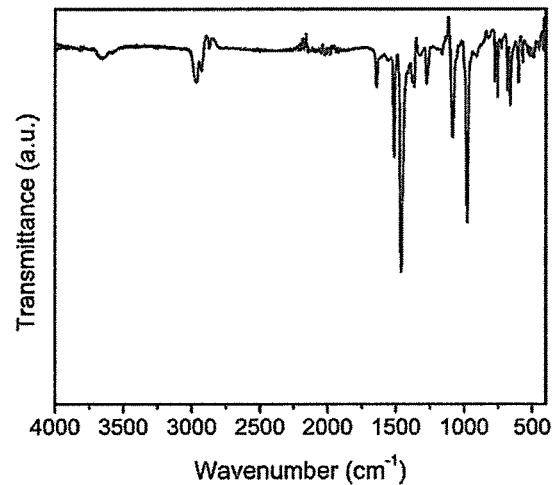
FIG. 11A-FIG. 11C are plots of the wavenumber (X-axis, labeled "Wavenumber cm$^{-1}$") vs. the transmittance (Y-axis, labeled "Transmittance (a.u.)") of different molecular complex examples described herein.
Figure 11B:
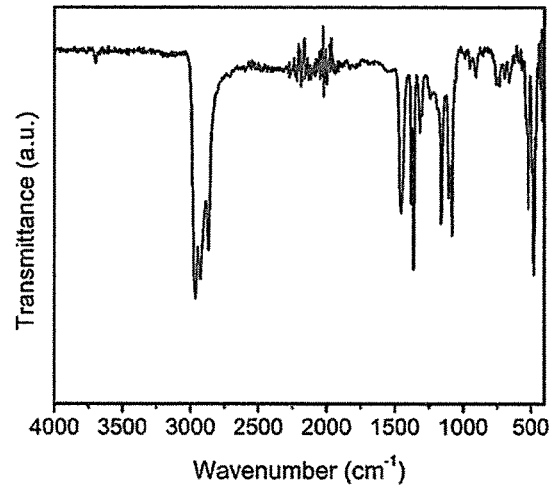
Figure 11C:
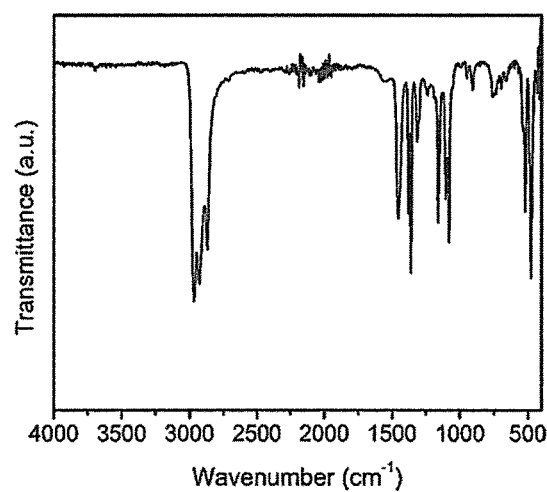
Figure 12A:
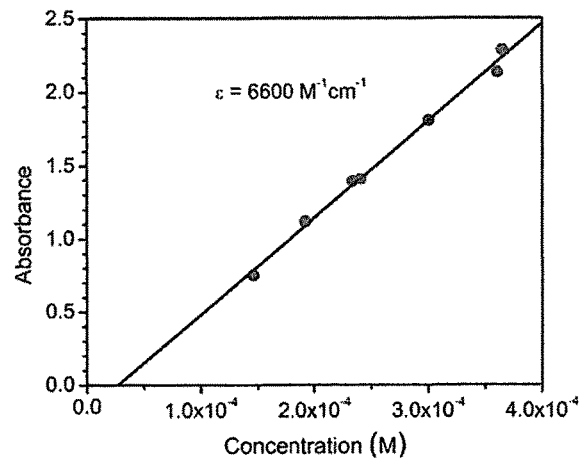
FIG. 12A-FIG. 12C are two plots of concentration (X-axis, labeled "Concentration (M)") vs. absorbance (Y-axis, labeled "Absorbance") and one plot of the wavenumber (X-axis, labeled "Wavenumber cm$^{-1}$") vs. the transmittance (Y-axis, labeled "Transmittance (a.u.)") of an example molecular complex.
Figure 12B:
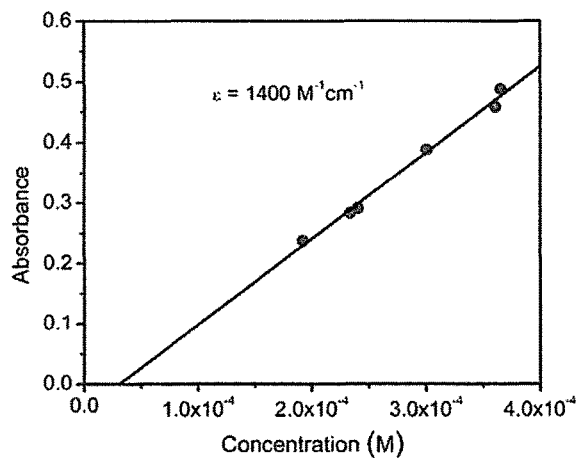
Figure 12C:
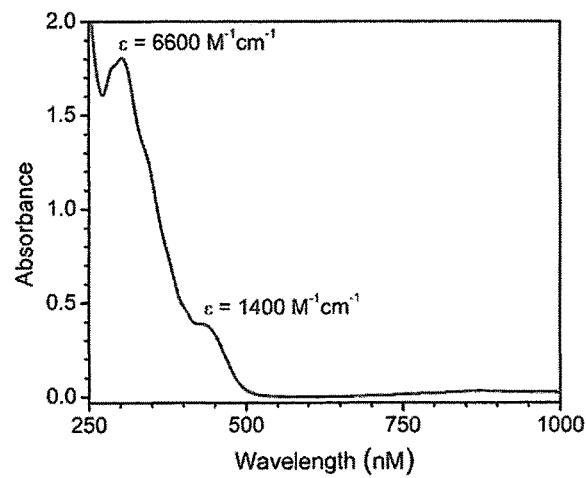
Figure 13A:
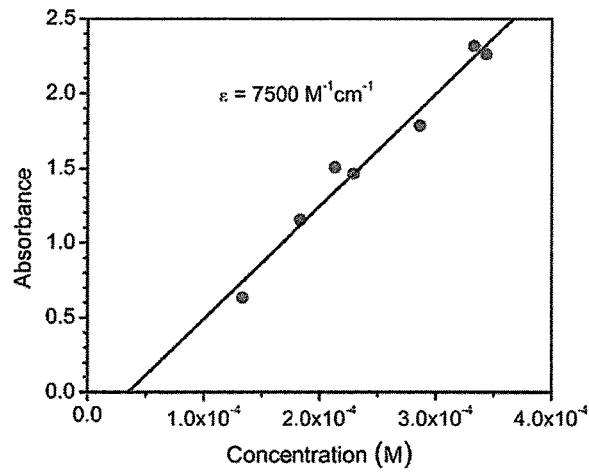
FIG. 13A-FIG. 13C are plots of concentration (X-axis, labeled "Concentration (M)") vs. absorbance (Y-axis, labeled "Absorbance") and one plot of the wavenumber (X-axis, labeled "Wavenumber cm$^{-1}$") vs. the transmittance (Y-axis, labeled "Transmittance (a.u.)") of an example molecular complex.
Figure 13B:
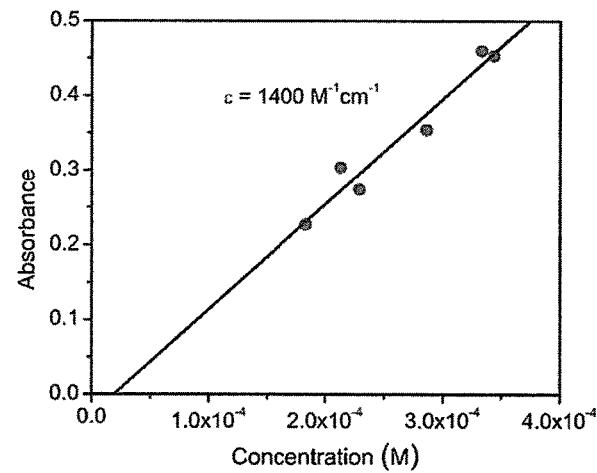
Figure 13C:
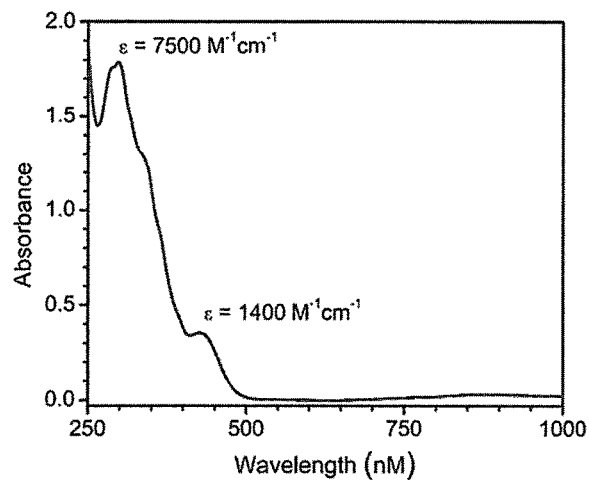

The Tb(Cp$^{iPr5}$)$_2$I was dissolved with benzene (10 mL) in a 25 mL Schlenk flask equipped with a Teflon magnetic stirring bar to give a yellow solution. Under vigorous stirring at room temperature, a solution of [H(SiEt$_3$)$_2$][B(C$_6$F$_5$)$_4$] (0.342 g/0.375 mmol) in benzene (5 mL) was added dropwise to the Tb(Cp$^{iPr5}$)$_2$I solution over 5 minutes. After stirring for 72 hours at room temperature, solvent was removed from the reaction mixture under vacuum, the residue was slurried with pentane (20 mL) for 0.5 hours and isolated as an orange powder on a medium-porosity fritted filter after washing with pentane (3×10 mL). This was dried under vacuum, dissolved in dichloromethane (4 mL), filtered with aid of Celite through a 0.2 μm porosity PTFE syringe filter and layered with pentane (15 mL) in a 20 mL vial. After 48 hours at 25° C. bright orange needle crystals were obtained. These were isolated on a medium-porosity fritted filter, washed with pentane (5 mL), benzene (5 mL) and pentane (5 mL). The crystallization was repeated and the crystals dried under vacuum to yield [Tb(Cp$^{iPr5}$)$_2$][B(C$_6$F$_5$)$_4$] as orange needles (0.330 g/0.238 mmol/51% based on TbI$_3$). C$_{64}$H$_{70}$BTbF$_2$O (1388.97): calculated (%) C, 55.34, H, 5.08; found (%) C, 55.18, H, 5.00. More characterization data are shown in FIG. 11A.

Example 8: Synthesis of [Tb(Cp$^{iPr5}$)$_2$]

Under argon, TbI$_3$ (0.361 g/0.670 mmol) and NaCp$^{iPr5}$ (0.50 g/1.67 mmol) were combined in a 35 mL pressure flask containing a glass-coated magnetic stirring bar and toluene (20 mL) was added. The reaction flask was covered in Al foil, and heated gradually to 160° C. with vigorous stirring. After 72 hour at 160° C., the flask was allowed to cool to room temperature, the reaction mixture was filtered through Celite and the pad washed with additional toluene (3×5 mL). Solvent was removed from the filtrate under vacuum and the residue was gently heated (50° C.) under vacuum for 1 hour. The residue was taken up in pentane (25 mL), stirred for 0.5 hours, filtered through Celite and the pad washed with additional pentane (3×5 mL). Solvent was removed from the filtrate under vacuum and the residue was gently heated (50° C.) under vacuum for 0.5 hours to give crude Tb(Cp$^{iPr5}$)$_2$I as a yellow powder.

Under argon, the crude Tb(Cp$^{iPr5}$)$_2$I was placed in a 50 mL Schlenk flask and dissolved with benzene (15 mL) to give a yellow solution, KC$_8$ (0.180 g/1.34 mmol) was added and the flask was covered in Al foil and allowed to stir at 25° C. for 6 days (reaction solution gradually changed from yellow to vibrant orange and bronze KC$_8$ slowly converted to black graphite). The solvent was removed under vacuum. The residue was extracted by stirring with hexane (25 mL) for 30 minutes, filtered through Celite, and the pad washed with additional hexane (3×5 mL) to give a vibrant orange filtrate. The solution was concentrated in a 40 mL vial under vacuum until copious precipitation of orange/amber solid (~10 mL); this was re-dissolved by heating the solution to boiling. The vial was then wrapped in Al foil and allowed to cool slowly to 25° C., after several days, orange amber crystals appeared and the vial was then left at −35° C. to complete the crystallization. Orange/amber prisms of [Tb(Cp$^{iPr5}$)$_2$] were isolated in two crops, washed with cold pentane (2×2 mL) and dried under vacuum (0.194 g/0.273 mmol/41% based on TbI$_3$). MALDI ToF MS m/z: 709.2 ([M]$^+$). C$_{40}$H$_{70}$Tb (709.93): calcd (%) C, 67.67, H, 9.94; found (%) C, 67.53, H, 9.68. More characterization data are shown in FIG. 11B and FIG. 12A-12C.

Example 9: Synthesis of [Dy(Cp$^{iPr5}$)$_2$]

Following the general procedure used for synthesis Examples 7 and 8, [Dy(Cp$^{iPr5}$)$_2$] was synthesized from DyI$_3$ (0.364 g/0.670 mmol), NaCp$^{iPr5}$ (0.50 g/1.67 mmol) and KC$_8$ (0.180 g/1.34 mmol). The crude product was recrystallized from hexane using the same method outlined in Example 8, yielding orange/amber prisms in two crops (0.231 g/0.324 mmol/48% based on DyI$_3$). MALDI ToF MS m/z: 713.4 ([M]$^+$). C$_{40}$H$_{70}$Dy (713.50): calculated (%) C, 67.34, H, 9.89; found (%) C, 67.20, H, 9.47. More characterization data are shown in FIG. 11C and FIG. 13A-13C.

Example 10: Synthesis of [Y(Cp$^{iPr4Et}$)$_2$][B(C$_6$F$_5$)$_4$]

Under argon, YI$_3$ (0.19 g/0.40 mmol) and NaCp$^{iPr4Et}$ (0.29 g/1.0 mmol) were combined in a 35 mL pressure flask containing a glass-coated magnetic stirring bar and toluene (15 mL) was added. The reaction flask was covered in Al foil, and heated gradually to 160° C. with vigorous stirring. After 72 hours at 160° C., the flask was allowed to cool to room temperature, the reaction mixture was filtered through Celite and the pad washed with additional toluene (3×5 mL). Solvent was removed from the filtrate under vacuum and the residue was gently heated (50° C.) under vacuum for 1 hour. The residue was taken up in pentane (25 mL), stirred for 0.5 hours, filtered through Celite and the pad washed with additional pentane (3×5 mL). Solvent was removed from the filtrate under vacuum and the residue was gently heated (50° C.) under vacuum for 0.5 hours to give crude Y(Cp$^{iPr4Et}$)$_2$I.

The Y(Cp$^{iPr4Et}$)$_2$I was dissolved with benzene (10 mL) in a 25 mL Schlenk flask equipped with a Teflon magnetic stirring bar. Under vigorous stirring at room temperature, a solution of [H(SiEt$_3$)$_2$][B(C$_6$F$_5$)$_4$] (0.29 g/0.32 mmol) in benzene (5 mL) was added dropwise to the Y(Cp$^{iPr4Et}$)$_2$I solution over 5 minutes. After stirring for 72 hours at room temperature, solvent was removed from the reaction mixture under vacuum, the residue was slurried with pentane (20 mL) for 0.5 hours and isolated as a powder on a medium-porosity fritted filter after washing with pentane (3×10 mL). This was dried under vacuum, dissolved in dichloromethane (4 mL), filtered with aid of Celite through a 0.2 μm porosity PTFE syringe filter and layered with pentane (16 mL) in a 20 mL vial. After 24 hours at 25° C. and 24 hours at −35° C. yellow needle crystals were obtained. These were isolated on a medium-porosity fritted filter, washed with pentane (5 mL), benzene (5 mL) and pentane (5 mL). The crystallization was repeated and the crystals dried under vacuum to yield [Y(Cp$^{iPr4Et}$)$_2$][B(C$_6$F$_5$)$_4$] as yellow needles (0.21 g/41% based on YI$_3$). $^1$H NMR (TCE-d$_2$, 500 MHz, 358 K): δ=1.14 (t, 6H, Cp-CH$_2$CH$_3$), 1.41 (m, 36H, Cp-CH(CH$_3$)$_2$), 1.50 (d, 12H, Cp-CH(CH$_3$)$_2$), 2.90 (q, 4H, Cp-CH$_2$CH$_3$), 3.30 (sept, 4H, Cp-CH(CH$_3$)$_2$), 3.39 (sept, 4H, Cp-CH(CH$_3$)$_2$). $^{13}$C{$^1$H} NMR (TCE-d$_2$, 125 MHz, 348 K): δ=15.88 (Cp-CH$_2$CH$_3$), 20.63 (Cp-CH$_2$CH$_3$), 22.56 (Cp-CH (CH$_3$)$_2$), 22.95 (Cp-CH(CH$_3$)$_2$), 23.33 (Cp-CH(CH$_3$)$_2$), 24.41 (Cp-CH(CH$_3$)$_2$) 26.59 (Cp-CH(CH$_3$)$_2$), 27.25 (Cp-CH (CH$_3$)$_2$), 132.89 (—C(iPr)—C(Et)-C(iPr)—), 137.24 (—C (iPr)—C(iPr)—C(iPr)—), 138.20 (—C(Et)-C(iPr)—C (iPr)—).

Figure 15A:
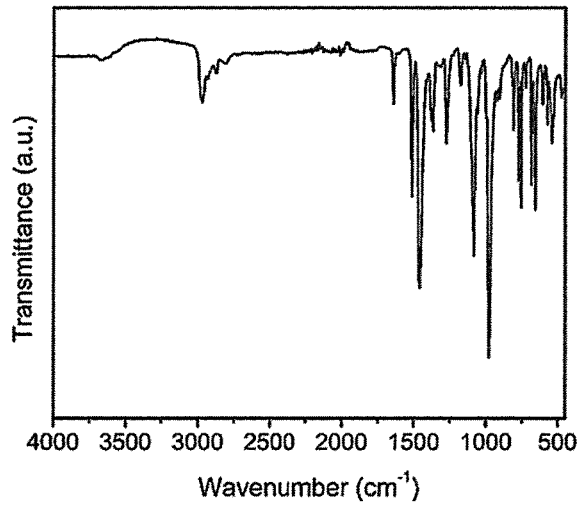
FIG. 15A-FIG. 15D are plots of the wavenumber (X-axis, labeled "Wavenumber cm$^{-1}$") vs. the transmittance (Y-axis, labeled "Transmittance (a.u.)") of different molecular complex examples described herein.
Figure 15B:
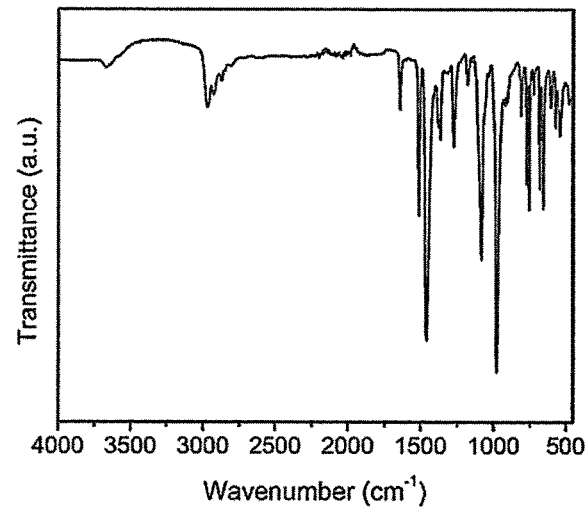
Figure 15C:
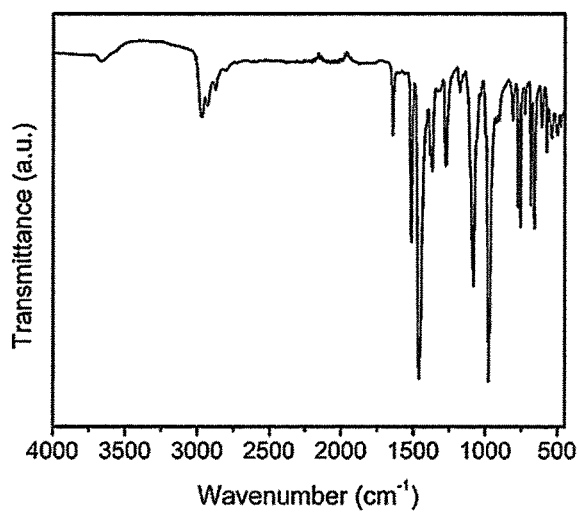
Figure 22A:
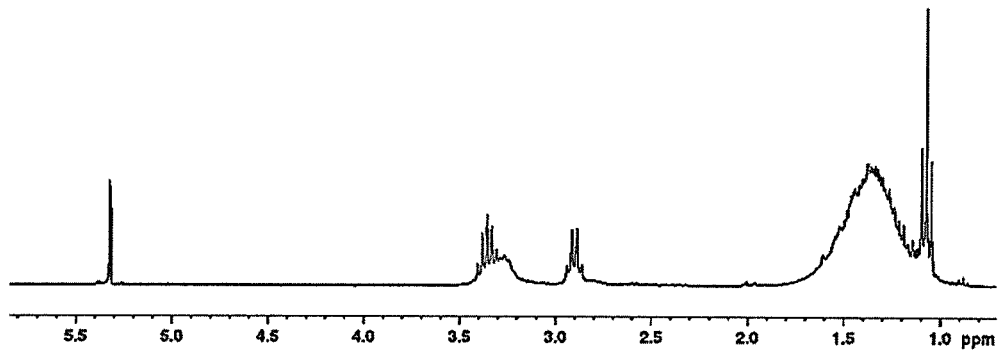
FIG. 22A-FIG. 22B are $^1$H NMR spectra of a molecular complex example described herein mixed in CD$_2$Cl$_2$ and TCE-d$_2$, respectively at different temperatures.
Figure 22B:
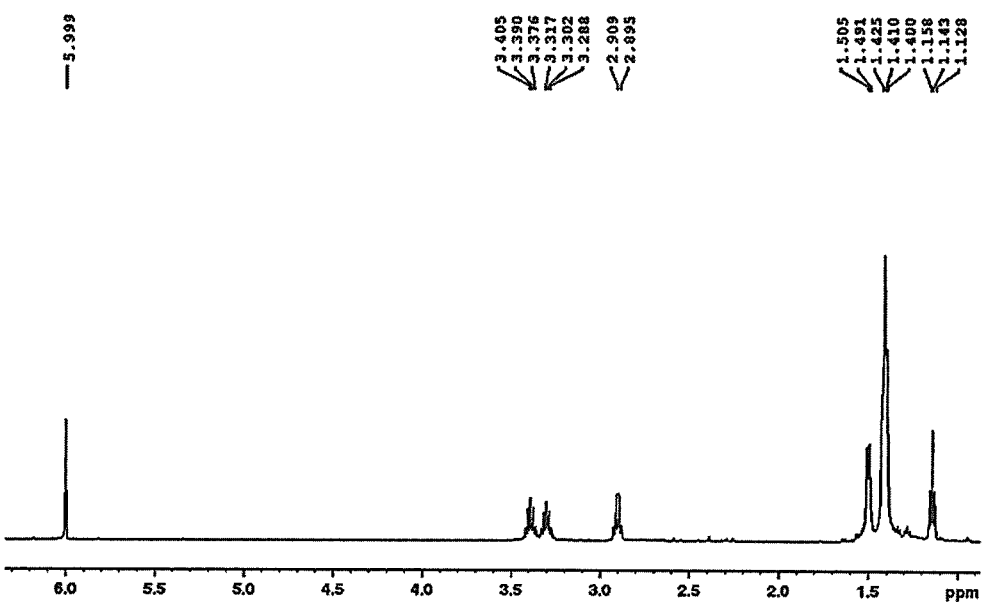
Figure 23:
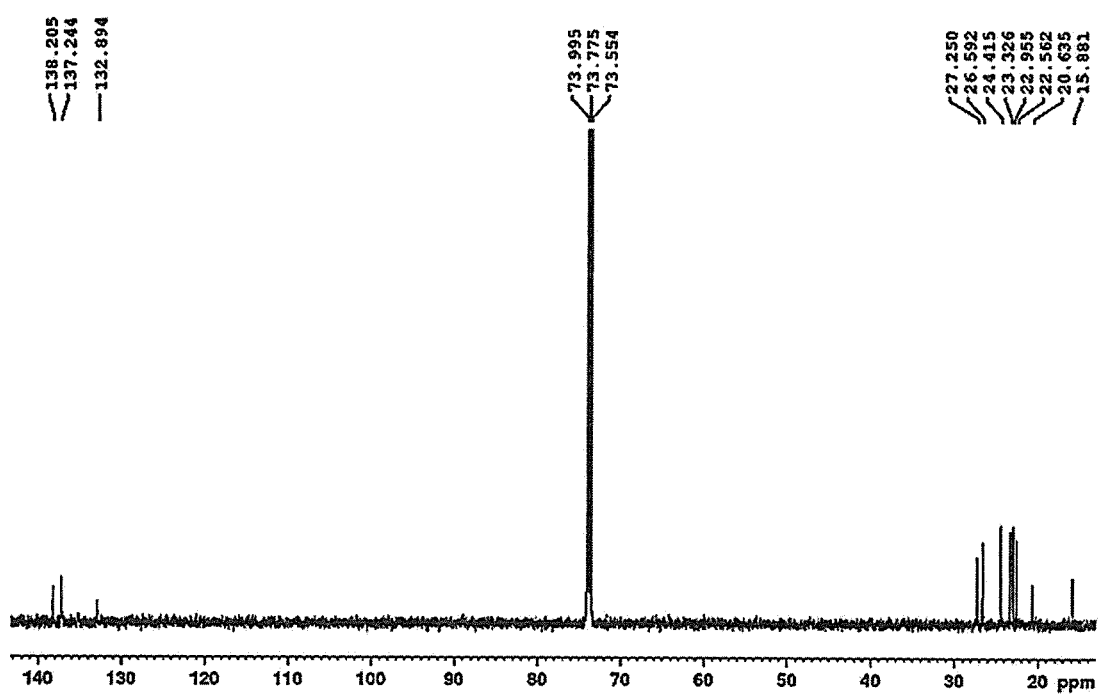
FIG. 23 is a $^{13}$C NMR spectrum of a molecular complex example described herein mixed in TCE-d$_2$ at 75° C.

C$_{62}$H$_{66}$BF$_{20}$Y (1290.89): calculated (%) C, 57.69, H, 5.15, Y 6.89; found (%) C, 57.45, H, 5.06, Y 7.01. More characterization data are shown in FIG. 15C, FIG. 22, and FIG. 23.

Example 11: Synthesis of [Y(Cp$^{iPr4}$)$_2$][B(C$_6$F$_5$)$_4$]

Figure 18A:
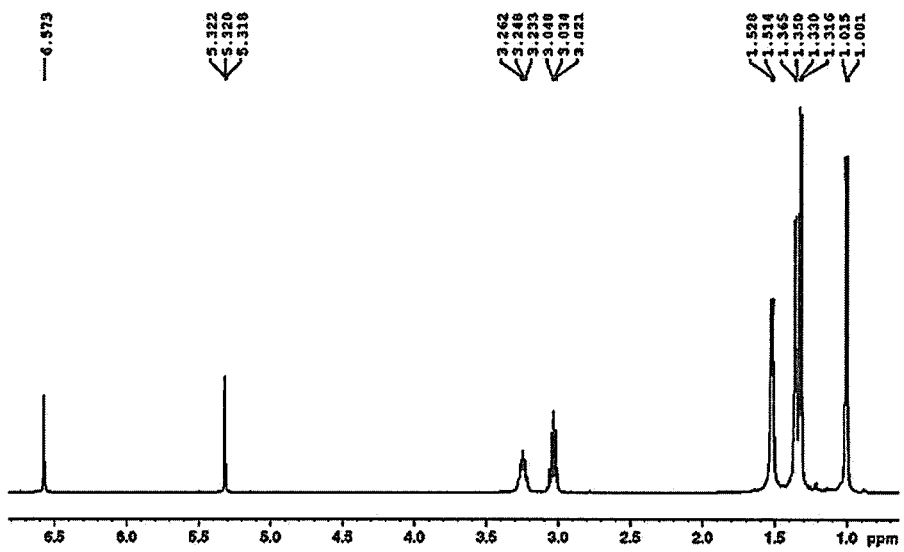
FIG. 18A-FIG. 18B are $^1$H NMR spectra of a molecular complex example described herein mixed in CD$_2$Cl$_2$ at different temperatures.
Figure 18B:
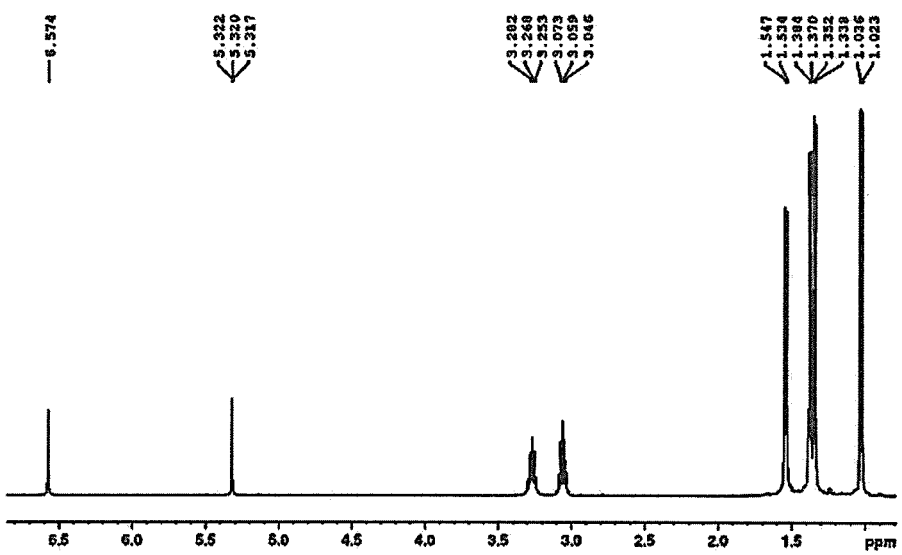
Figure 19A:
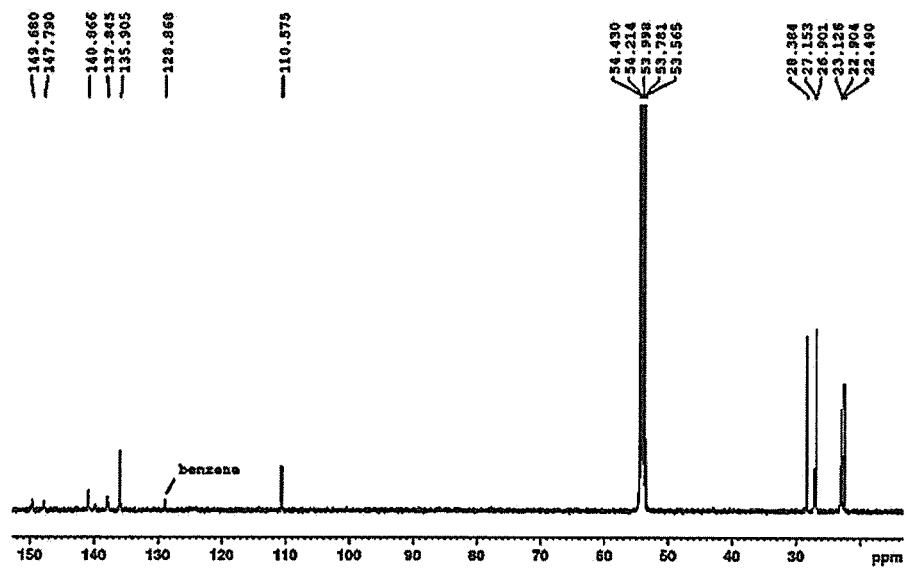
FIG. 19A-FIG. 19B are $^{13}$C NMR spectra of a molecular complex example described herein mixed in CD$_2$Cl$_2$ at different temperatures.
Figure 19B:
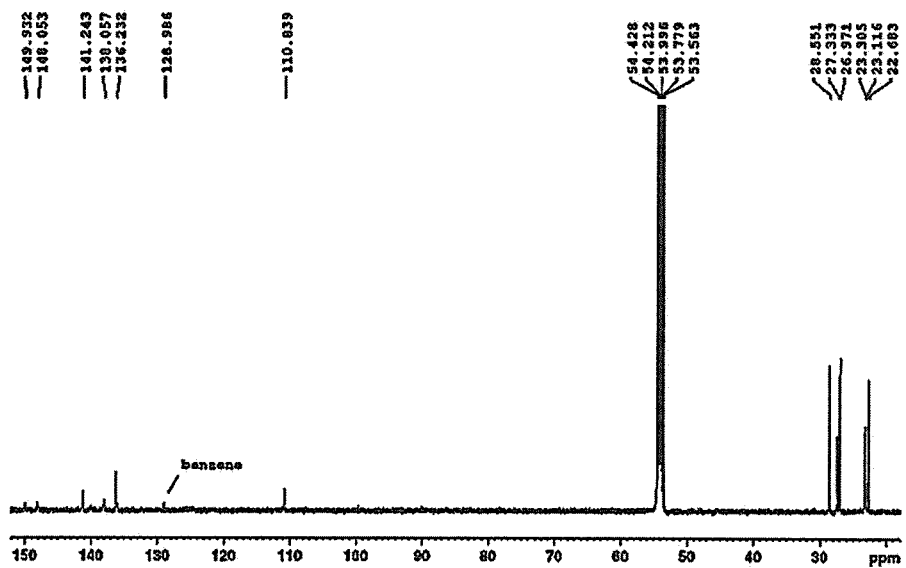

Following the general procedure used for synthesis of Example 10, [Y(Cp$^{iPr4}$)$_2$][B(C$_6$F$_5$)$_4$] was synthesized from YI$_3$ (0.22 g/0.47 mmol), NaCp$^{iPr4}$ (0.30 g/1.17 mmol) and [H(SiEt$_3$)$_2$][B(C$_6$F$_5$)$_4$] (0.34 g/0.37 mmol). The product was recrystallized twice using the same method outlined for Example 10 to yield colorless prisms of [Y(Cp$^{iPr4}$)$_2$][B (C$_6$F$_5$)$_4$] (0.30 g/52% based on YI$_3$). $^1$H NMR (CD$_2$Cl$_2$, 500 MHz, 298 K): δ=1.01 (d, 12H, Cp-CH(CH$_3$)$_2$), 1.32 (d, 12H, Cp-CH(CH$_3$)$_2$), 1.36 (d, 12H, Cp-CH(CH$_3$)$_2$), 1.52 (d, 12H, Cp-CH(CH$_3$)$_2$), 3.04 (sept, 4H, Cp-CH(CH$_3$)$_2$), 3.25 (sept, 4H, Cp-CH(CH$_3$)$_2$), 6.57 (s, 2H, Cp-H). $^{13}$C{$^1$H} NMR (CD$_2$Cl$_2$, 125 MHz, 298 K): δ=22.49, 22.90, 23.13, 26.90, 27.15, 28.38, 110.57, 135.90, 137.84, 140.87, 147.79, 149.68. C$_{58}$H$_{58}$BF$_{20}$Y (1234.79): calculated (%) C, 56.42, H, 4.73, Y 7.20; found (%) C, 55.95, H, 4.72, Y 7.21. More characterization data are shown in FIG. 15A, FIG. 18, and FIG. 19.

Example 12: Synthesis of [Y(Cp$^{iPr4Me}$)$_2$][B(C$_6$F$_5$)$_4$]

Figure 20A:
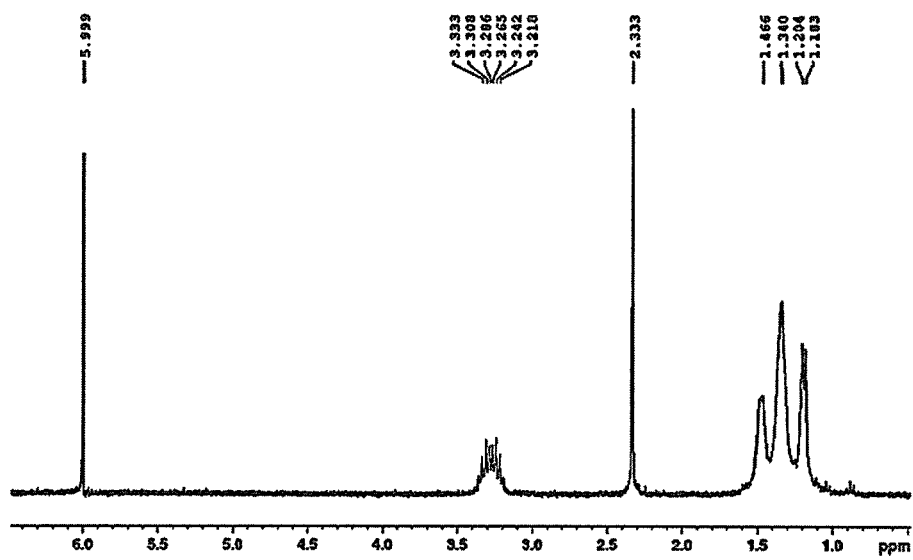
FIG. 20A-FIG. 20B are $^1$H NMR spectra of a molecular complex example described herein mixed in TCE-d$_2$ at different temperatures.
Figure 20B:
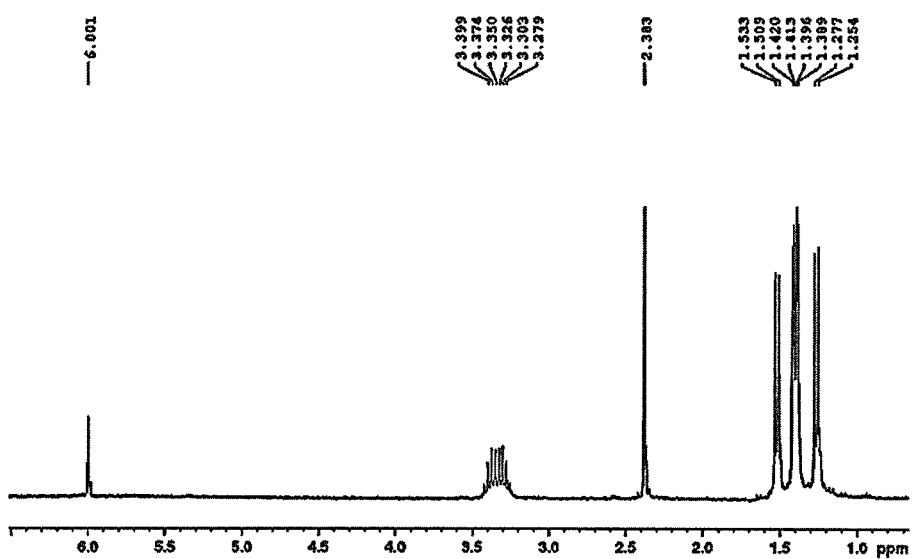
Figure 21:
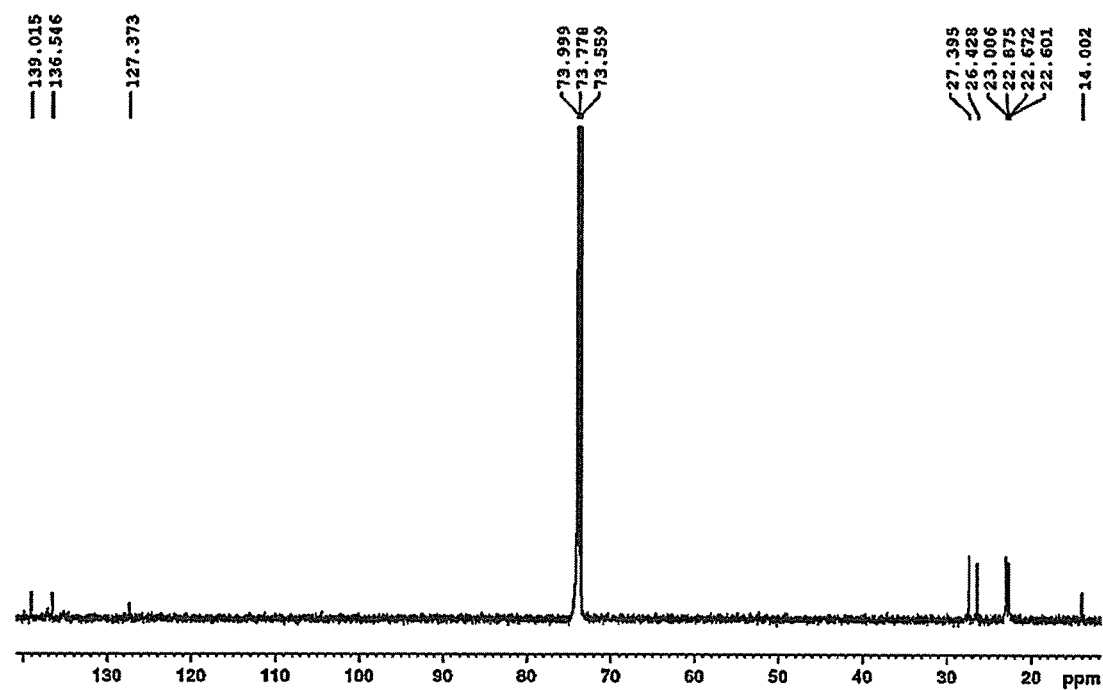
FIG. 21 is a $^{13}$C NMR spectrum of a molecular complex example described herein mixed in TCE-d$_2$ $_2$ at 75° C.

Following the general procedure used for synthesis of Example 10, [Y(Cp$^{iPr4Me}$)$_2$][B(C$_6$F$_5$)$_4$] was synthesized from YI$_3$ (0.17 g/0.36 mmol), NaCp$^{iPr4Me}$ (0.25 g/0.92 mmol) and [H(SiEt$_3$)$_2$][B(C$_6$F$_5$)$_4$] (0.27 g/0.30 mmol). The product was recrystallized twice using the same method outlined for Example 10 to yield yellow prisms of [Y(Cp$^{iPr4Me}$)$_2$][B(C$_6$F$_5$)$_4$] (0.24 g/51% based on YI$_3$). $^1$H NMR (TCE-d$_2$, 300 MHz, 348 K): δ=1.26 (d, 12H, Cp-CH (CH$_3$)$_2$), 1.40 (d, 12H, Cp-CH(CH$_3$)$_2$), 1.41 (d, 12H, Cp-CH (CH$_3$)$_2$), 1.52 (d, 12H, Cp-CH(CH$_3$)$_2$), 3.30 (sept, 4H, Cp-CH(CH$_3$)$_2$), 3.37 (sept, 4H, Cp-CH(CH$_3$)$_2$). $^{13}$C{$^1$H} NMR (TCE-d$_2$, 125 MHz, 348 K): δ=14.00 (Cp-CH$_3$), 22.60 (Cp-CH(CH$_3$)$_2$), 22.67 (Cp-CH(CH$_3$)$_2$), 22.87 (Cp-CH (CH$_3$)$_2$), 23.01 (Cp-CH(CH$_3$)$_2$), 26.42 (Cp-CH(CH$_3$)$_2$), 27.39 (Cp-CH(CH$_3$)$_2$), 127.37 (—C(iPr)—C(Me)-C (iPr)—), 136.55 (—C(iPr)—C(iPr)—C(iPr)—), 139.01 (—C(Me)-C(iPr)—C(iPr)—). C$_{60}$H$_{62}$BF$_{20}$Y (1262.84): calculated (%) C, 57.07, H, 4.95, Y 7.04; found (%) C, 56.80, H, 4.81, Y 7.16. More characterization data are shown in FIG. 15B, FIG. 20, and FIG. 21.

Example 13: Synthesis of [Y(Cp$^{iPr5}$)$_2$][B(C$_6$F$_5$)$_4$]

Figure 15D:
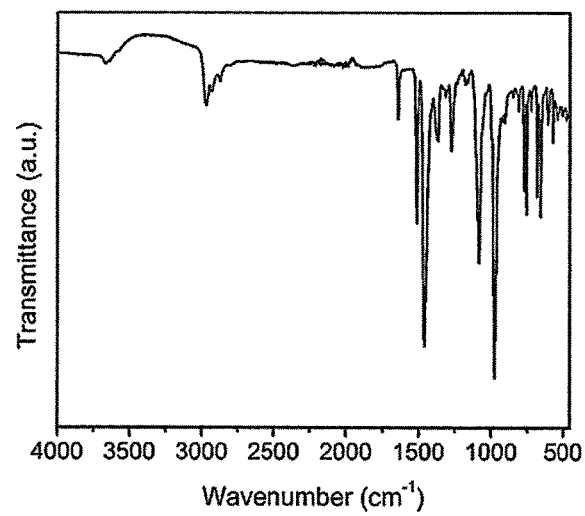
Figure 24:
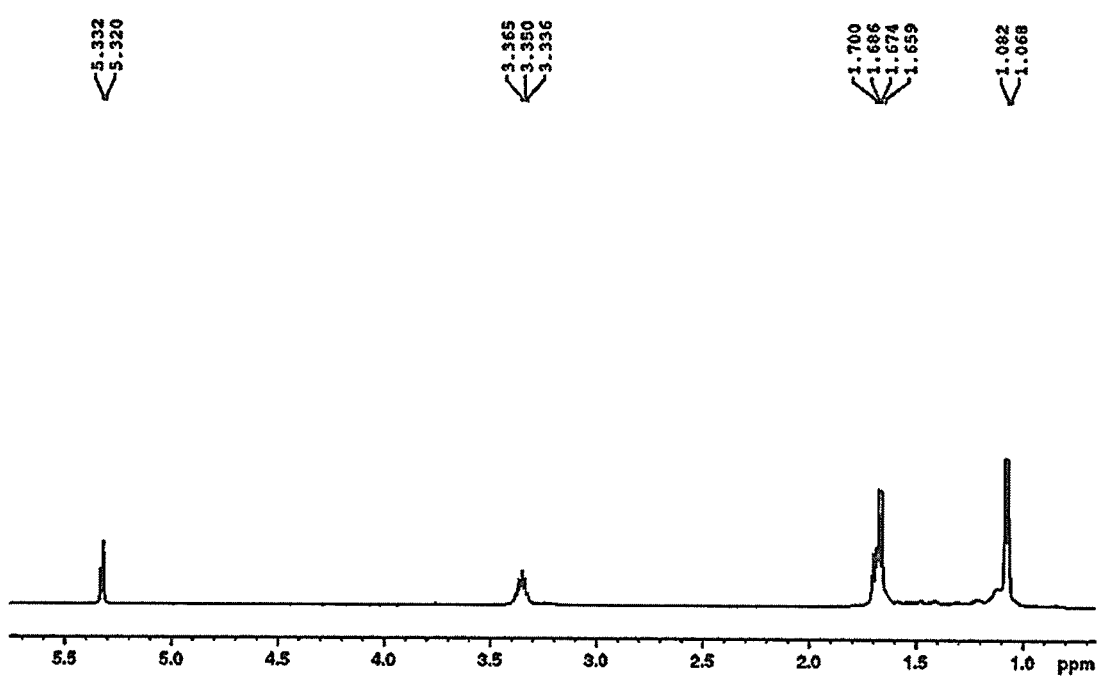
FIG. 24 is an $^1$H NMR spectrum of a molecular complex example described herein mixed in CD$_2$Cl$_2$ at −10° C.
Figure 25:
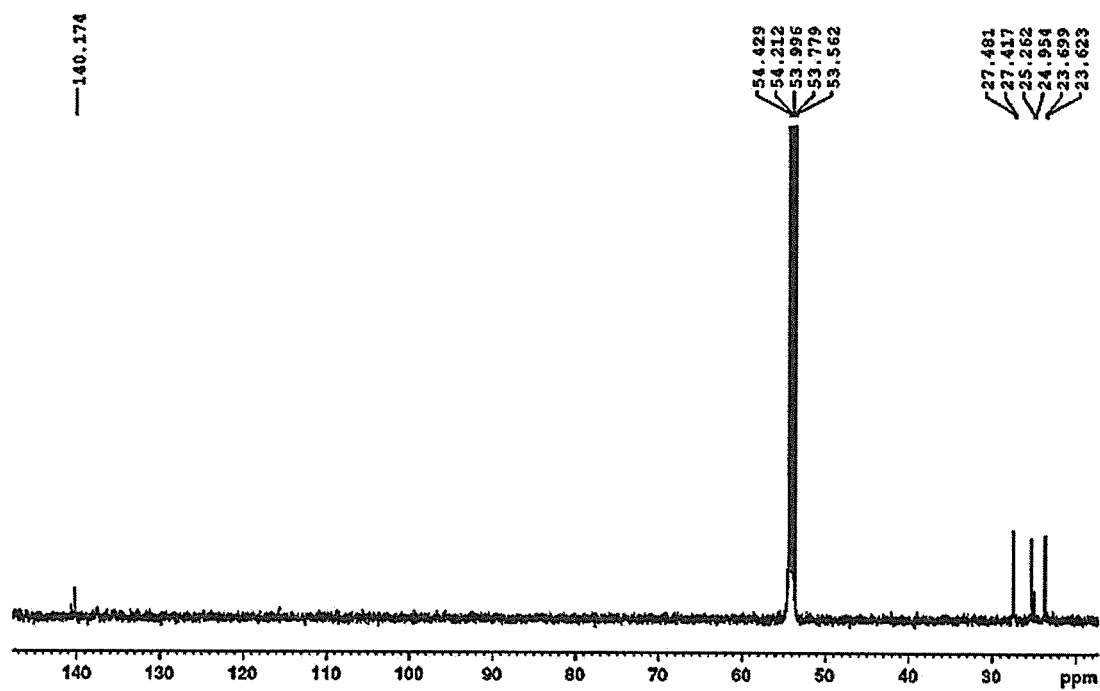
FIG. 25 is a $^{13}$C NMR spectrum of a molecular complex example described herein mixed in CD$_2$Cl$_2$ at −10° C.

Following the general procedure used for synthesis of Example 10, [Y(Cp$^{iPr5}$)$_2$][B(C$_6$F$_5$)$_4$] was synthesized from YI$_3$ (0.19 g/0.40 mmol), NaCp$^{iPr5}$ (0.30 g/1.00 mmol) and [H(SiEt$_3$)$_2$][B(C$_6$F$_5$)$_4$] (0.29 g/0.32 mmol). The product was recrystallized three times using the same method outlined for Example 10 to yield yellow needles of [Y(Cp$^{iPr5}$)$_2$][B (C$_6$F$_5$)$_4$] (0.16 g/30% based on YI$_3$). $^1$H NMR (CD$_2$Cl$_2$, 500 MHz, 263 K): δ={1.07 outer CH$_3$ of both isomers}(d, 30H, Cp-CH(CH$_3$)$_2$), {1.66 inner CH$_3$ of isomer A, 1.69 inner CH$_3$ of isomer B} (d, 30H, Cp-CH(CH$_3$)$_2$), 3.35 (sept, 10H, Cp-CH(CH$_3$)$_2$). $^{13}$C{1H} NMR (CD$_2$Cl$_2$, 125 MHz, 263 K): δ=23.62 (Cp-CH(CH$_3$)$_2$), 23.70 (Cp-CH(CH$_3$)$_2$), 24.95 (Cp-CH(CH$_3$)$_2$), 25.62 (Cp-CH(CH$_3$)$_2$), 27.42 (Cp-CH(CH$_3$)$_2$), 27.48 (Cp-CH(CH$_3$)$_2$), 140.17 (—C(iPr)—C(iPr)—C (iPr)—). C$_{64}$H$_{70}$BF$_{20}$Y (1318.95): calculated (%) C, 58.28, H, 5.35, Y 6.74; found (%) C, 57.73, H, 5.05, Y 6.35. More characterization data are shown in FIG. 15D, FIG. 24, and FIG. 25.

Example 14: Structural Parameters and Magnetic Data for [Dy(Cp$^{iPr4R}$)$_2$][B(C$_6$F$_5$)$_4$] (R=H), Me, Et, iPr)

The Dy-Cp separations, as assessed by the distances from the Dy atom to the centroid of each cyclopentadienyl ligand, lie in the ranges 2.27(1)-2.30(1) Å for [Dy(Cp$^{iPr4}$)$_2$][B (C$_6$F$_5$)$_4$], 2.273(3)-2.382(3) Å for [Dy(Cp$^{iPr4Me}$)$_2$] [B(C$_6$F$_5$)$_4$], 2.297(4)-2.306(4) Å for [Dy(Cp$^{iPr4Et}$)$_2$][B (C$_6$F$_5$)$_4$], and 2.245(15)-2.392(16) Å for [Dy(Cp$^{iPr5}$)$_2$][B (C$_6$F$_5$)$_4$]. A trend can be drawn from the major component in each of the crystal structures: the average Dy-Cp(centroid) distances for the major component are shown in Table 1. Although the average Dy-Cp(centroid) distance does not vary by more than the statistical error in some adjacent members of the series (e.g., 1 and 2), the change is statistically significant across the series as a whole. Similarly, the average Dy—C distances for the major component increased. The increase with both the average Dy-Cp(centroid) and Dy—C distances suggests elongation of the interaction between the Dy atom and the cyclopentadienyl rings as the series progresses from 1 to 4. In addition, the Cp-Dy-Cp angle and the planes formed by the cyclopentadienyl rings increase across the series as shown in Table 1. These structural trends are consistent with the expected steric environment imposed by the cyclopentadienyl ligands; that is, more sterically-encumbered substituents prompt the two cyclopentadienyl ligands in [Dy(Cp$^{iPr4R}$)$_2$]+ to be positioned further away from each other, increasing linearity and lengthening the average Cp-Dy bond distance.

TABLE 1

Structural parameters and magnetic data for
[Dy(Cp$^{iPr4R}$)$_2$][B(C$_6$F$_5$)$_4$] (R = H (1),
Me (2), Et (3), iPr (4))

|  | 1 | 2 | 3 | 4 | [(Cp''')$_2$Dy]$^{+e}$ |
|---|---|---|---|---|---|
| Cp-Dy-Cp$^a$ (°) | 147.2 | 156.6 | 161.1 | 162.1 | 152.70 |
| Dy-Cp$^b$ (Å) | 2.290 | 2.298 | 2.302 | 2.340 | 2.316 |
| U$_{eff}$(cm$^{-1}$) | 1285 | 1468 | 1380 | 1334 | 1223 or 1277 |
| T$_b^c$ (K) | 17 | 62 | 59 | 56 | 53 |
| τ$_{tunnel}$ (s) | 439 | 2452 | 447 | 1187 | N/A |
| T$_{max}^d$ (K) | 32 | 72 | 66 | 66 | 60 |
| 2 K M$_r$ (μ$_B$) | 2.6 | 4.4 | 3.9 | 4.2 | 4.2 |
| 2 K H$_c$ (T) | 1.4 | 2.4 | 1.4 | 1.8 | 2.4 |

$^a$Average value for all positions in the crystal structure.
$^b$Average value for the highest occupancy component in the crystal structure.
$^c$T$_b$ is defined as the 100 s magnetic blocking temperature.
$^d$T$_{max}$ is the maximum hysteresis temperature.
$^e$Values are an average from publicly available information.

Figure 6:
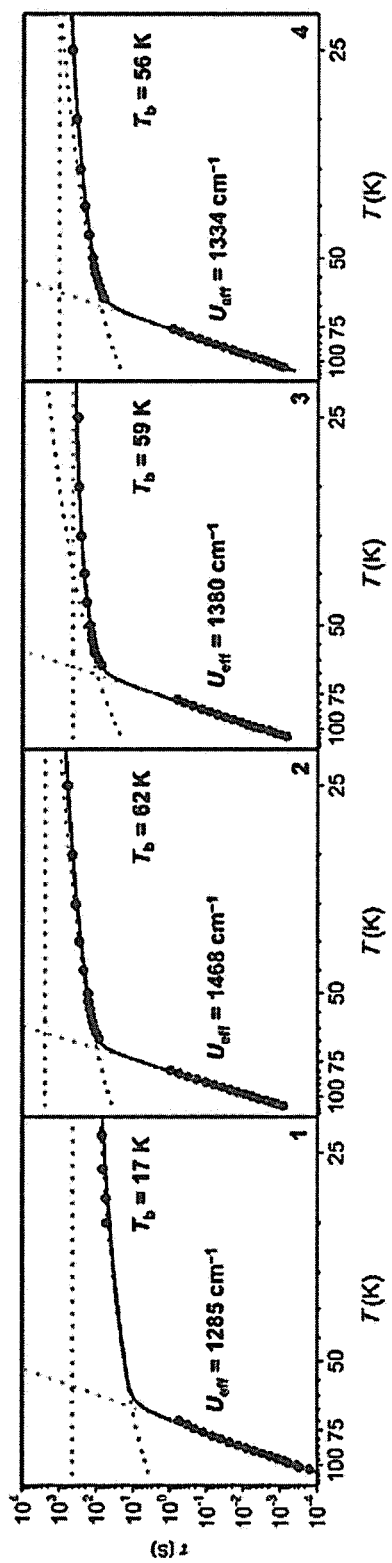
FIG. 6 is plots of the temperature (X-axis, labeled "T(K)") vs. the magnetic relaxation time (i (s)) for different examples of molecular complexes described herein.
Figure 7:
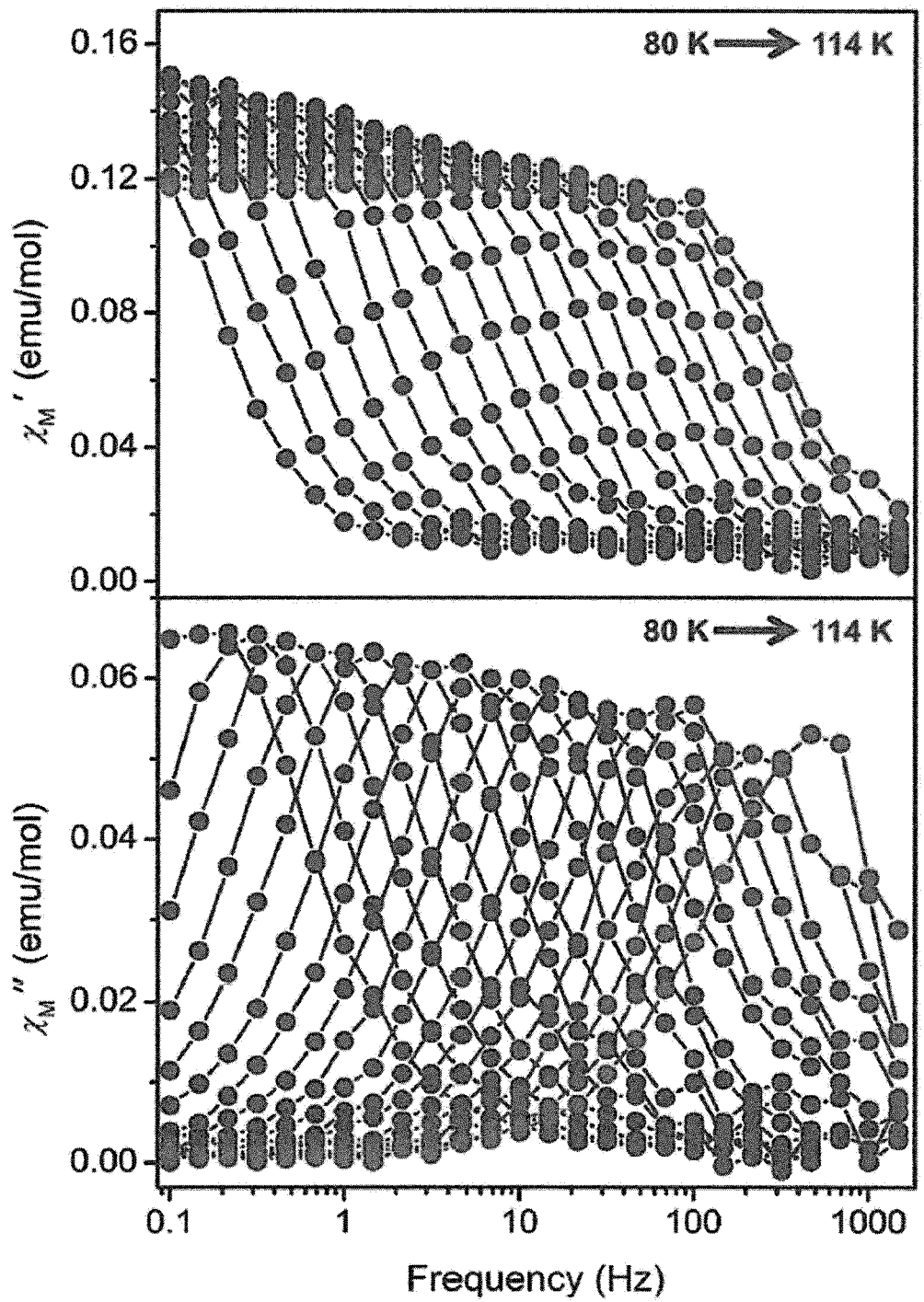
FIG. 7 is two plots of the frequency (X-axis, labeled "Frequency (Hz)") vs. the ac magnetic susceptibility for in-phase (Y-axis labeled "X'$_M$") and out-of-phase (Y-axis, labeled "X'$_M$") components of a molecular complex example under zero applied dc field.

High-temperature magnetic relaxation in complexes 1 through 4 were probed by ac magnetic susceptibility measurements from 70 K to 114 K. Magnetic relaxation times, s, were extracted from a simultaneous fit of in-phase (X') and out-of phase (X") components of the magnetic susceptibility to a generalized Debye model as shown in FIG. 7. Despite the two molecules observed in the crystal structures of 1 and 2, and the positional disorder in 2 and 4, only one peak was observed in the ac susceptibility data for each compound. FIG. 6 shows this high temperature regime (i.e., the ac susceptibility shown by the data points near the $U_{eff}$ value), which includes Arrhenius plots of inverse temperature versus the natural log of s. All data could be calculated to yield the thermal barriers to magnetic relaxation ($U_{eff}$) for each molecule shown in Table 1. These $U_{eff}$ values surpass those reported for [Dy(Cp''')$_2$]$^+$ shown in Table 1.

FIG. 6 also shows the magnetic relaxation behavior of each of the complexes 1-4 in Table 1. At lower temperatures, dc magnetic relaxation measurements were conducted for complexes 1-4 from 2 K to 64 K (data points above the Tb value). Relaxation times were extracted from magnetization versus time plots by fitting the data with a stretched exponential function. The temperature dependence at intermediate temperatures (20 K to 64 K) is indicative of Raman relaxation, while at low temperatures the relaxation time tends toward a constant value, indicative of quantum tunneling of the magnetization.

Hundred-second magnetic blocking temperatures for complexes 1 through 4 were extracted from the dc magnetic relaxation data, yielding the Tb values shown in Table 1. The values for complexes 2 through 4 all surpass the 100 s blocking temperature of 53 K measured for [Dy(Cp''')$_2$]$^+$. While $\tau$=100 s has been chosen as the benchmark relaxation time for comparing blocking temperatures, complex 2 shows longer magnetic relaxation times than [Dy(Cp''')$_2$]$^+$ across the entire temperature range measured (2K to 114 K).

The rates of quantum tunneling of the magnetization, $\tau_{tunnel}$, extracted from dc relaxation measurements are among the slowest reported for mononuclear single-molecule magnets. The trend in $\tau_{tunnel}$ for complexes 1-4 in Table 1 deviates from that observed for $T_b$; namely, compounds 1 and 3 show the fastest quantum tunneling of the magnetization, while 2 and 4 show much larger $\tau_{tunnel}$ values.

Magnetic hysteresis data were collected for complexes 1 through 4 in Table 1 at several temperatures in the range 2 K to 72 K by sweeping the field between 7 T and −7 T. For fields below 2 T, a magnetic field sweep rate of 3.1(4) mT s$^{-1}$ was employed, similar to that used in hysteresis measurements of [Dy(Cp''')$_2$]$^+$. A step is observed at zero field at 2 K, resulting in remanent magnetization values ($M_r$) of complexes 1 through 4 shown in Table 1. The magnitude of the remanent magnetization and the coercive field (He) for each complex mirrors the trend in $\tau_{tunnel}$ values.

The hysteresis loops remain open at high temperatures as shown for complexes 1 through 4 in Table 1 as $T_{max}$. The maximum temperatures in the case of complexes 2 through 4 are higher than the 60 K maximum determined for [Dy(Cp''')$_2$]$^+$, and this observation is consistent with the trend observed in Tb. Notably, the maximum hysteresis temperature for complex 2 in Table 1 is the highest that has yet been reported for a single-molecule magnet, approaching the temperature of liquid nitrogen (77 K).

Example 15: X-Ray Crystallography Data for [DyCp$^{iPr4R}$$_2$][B(C$_6$F$_5$)$_4$] (R=H (1), Me (2), Et (3), iPr (4)) SMMs Single crystal X-ray diffraction data of Examples 3, 4, 5, and 6 were collected (see FIG. 26). The sample was coated with Parabar oil and mounted on a MiTeGen polyimide loop in a nitrogen filled glovebox. The X-ray intensity data were measured using a Bruker SMART Apex II diffractometer at 100 K under a N$_2$ stream of an Oxford Cryostems Cryostream with MoKα radiation (graphite monochrometer). Data was collected from four 180° ω scans with 0.5° steps at 900 rotation intervals about q and a CCD detector distance of 5 cm. The frames were integrated with the Bruker SAINT Software package using a narrow-frame algorithm.

Single crystal X-ray diffraction data of Examples 3, 5, and 6 were collected at Beamline 12.2.1 at the Advanced Light Source, Lawrence Berkeley National Laboratory using synchrotron radiation (λ=0.7288 Å). Single crystals were coated with Paratone-N oil, mounted on a MiTeGen loop, and frozen at 100 K under a N2 stream of an Oxford Cryostems Cryostream 700 Plus on a Bruker AXS D8 diffractometer. Data were collected through a combination of 4° and 1°φ and ω scans with a Bruker PHOTON 100 CMOS detector. Data reduction was performed through SAINT and absorption correction through SADABS, via Bruker AXS APEX III software. Structure solutions were performed by SHELXT using the direct method and were refined by least-square refinement against F$^2$ by SHELXL following standard procedures through the integrated structure analysis program OLEX2.

For [Dy(Cp$^{iPr4H}$)$_2$][B(C$_6$F$_5$)$_4$] (Example 3), the compound crystallized in the space group P2$_1$ with two molecules in the asymmetric unit. Initial space group determination suggested significant symmetry fulfillment of an orthorhombic P2$_1$2$_1$2$_1$ cell, which pointed to the sign of pseudo-merohedral twinning about a two-fold rotational axis along the a axis. The structure was best modeled in P2$_1$ with a two-fold rotational axis along a as a twin law. In addition, Flack parameter refinement indicated that the crystal was also twinned by inversion. Refinement with four-component twin yielded the twin ratio of 0.29:0.289:0.212: 0.209.

Anisotropic refinement of the Cp rings was stabilized by the application of equal anisotropic displacement parameters within the groups of five C atoms of the Cp rings (C1 to C5, C18 to C22, and C52 to C56), the four tertiary C atoms of the isopropyl groups (C6, C9, C12, C15; C23, C26, C29, C32; C40, C43, C46, C49; and C57, C60, C63, C66), the eight terminal—CH3 arms of the isopropyl groups (C7, C8, C10, C11, C13, C14, C16, C17; C24, C25, C27, C28, C30, C31, C33, C34; C41, C42, C44, C45, C47, C48, C50, C51; and C58, C59, C61, C62, C64, C65, C67, C68).

The two [B(C$_6$F$_5$)$_4$]− anions in the asymmetric unit were also subjected to equal anisotropic displacement parameters restraints: five F atoms on the same phenyl group were restrained to have the same anisotropic parameters. Five out of eight phenyl rings of the two [B(C$_6$F$_5$)$_4$]− anions were subjected to equal anisotropic displacement parameters restraints.

Anomalous electron density was found near C42, which was found to interfere with modeling the disopropyl group. Therefore, C40-C41 and C40-C42 distances were restrained to a fixed value of 1.54 Å. Results for this data are shown in Table 2 and Table 3 below.

Figure 26:
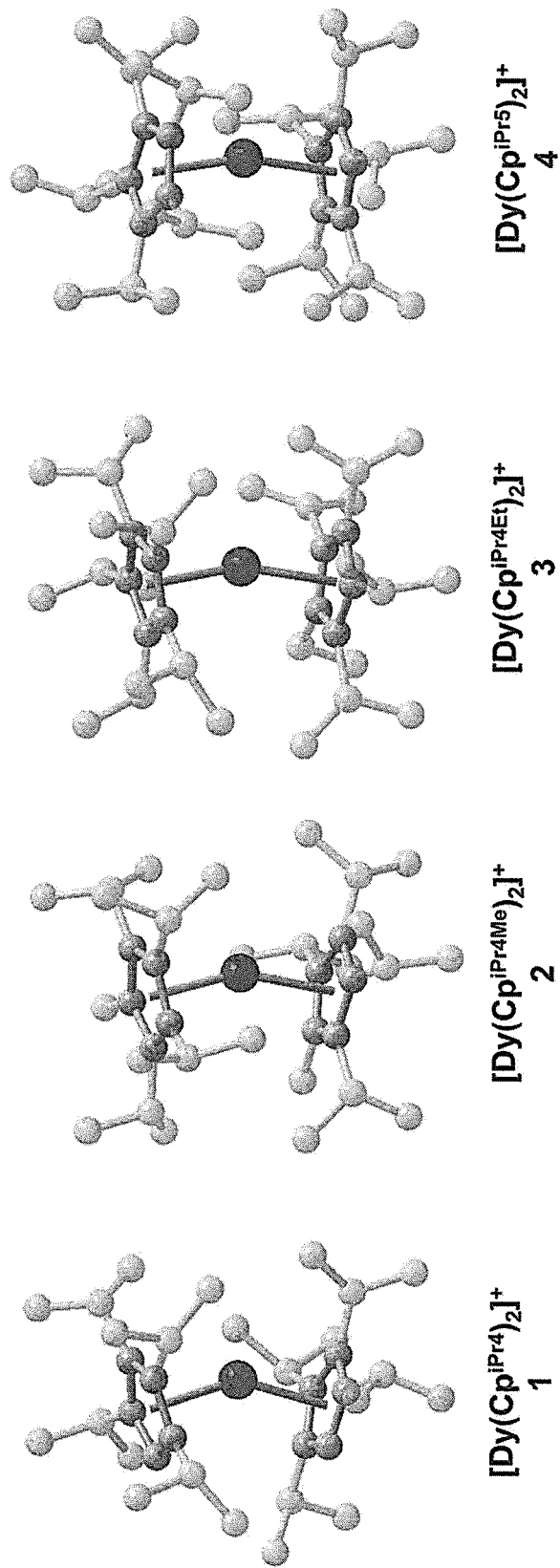
FIG. 26 is the crystal structures of four different examples of molecular complexes described herein.

For [Dy(Cp$^{iPr4Me}$)$_2$][B(C$_6$F$_5$)$_4$] (Example 5), the compound crystallized in the P2$_1$/c space group with two molecules in the asymmetric unit. The crystal was found to be twinned by pseudo-merohedry, and a two-fold rotational axis along the a axis was used as a twin law. Twin refinement results in a two-component twin with a ratio of 0.82:0.18. For each dysprosenium cation in the structure, one Cp ring was found to be disordered over two positions. The occupancies of the two components were refined while constraining the sum to unity and yielded ratios of 0.589:0.411 and 0.636:0.364 for the first and second dysprosenium ions, respectively. In refining the Cp disorder, the distance between C65A and C66A was restrained. Anisotropic displacement parameters of each disordered Cp ring were restrained to be the same in order to stabilize the refinement. The data is shown in Table 2 and Table 3 below. The crystal structures for each molecular complex shown in Table 2 and Table 3 are shown in FIG. 26. For $[Dy(Cp^{iPr4Et})_2][B(C_6F_5)_4]$ (Example 6), the compound crystallized in the $P2_1/n$ space group with one molecule in the asymmetric unit. For each Cp ring, one of the isopropyl groups adjacent to the ethyl substituent exhibited signs of disorder. For the first Cp ring, the isopropyl group was modeled such that one —CH3 group (C38) was disordered over two positions. Refinement yielded an occupancy ratio of 0.63:0.37. The data is shown below in Table 2 and Table 3 below.

For $[Dy(Cp^{iPr5})_2][B(C_6F_5)_4]$ (Example 3), the compound crystallized in the $P2_1/n$ space group with one molecule in the asymmetric unit. Anisotropic refinement of the Dy atom resulted in unusually large thermal displacement parameters. The occupancy sum of the four Dy positions was constrained to unity, and the occupancy refined to the ratio of 0.408:0.275:0.119:0.197. The ten isopropyl groups on the two Cp rings were found to be disordered and were modeled over two positions. The data is shown below in Table 2 and Table 3 below.

TABLE 3

Bond distances and Angles for for $[Dy(Cp^{iPr4R})_2][B(C_6F_5)_4]$ (R = H (1), Me (2), Et (3), iPr (4))

| R = | H (1) | Me (2) | Et (3) | iPr (4) |
|---|---|---|---|---|
| Dy1-C1 | 2.60(2) | 2.623(8) | 2.608(8) | 2.508(9) |
| Dy1-C2 | 2.58(2) | 2.672(7) | 2.677(7) | 2.551(10) |
| Dy1-C3 | 2.57(2) | 2.648(7) | 2.615(7) | 2.726(10) |
| Dy1-C4 | 2.63(2) | 2.567(7) | 2.527(7) | 2.772(10) |
| Dy1-C5 | 2.58(2) | 2.544(8) | 2.533(7) | 2.651(9) |
| Dy1-C1$^a$ | 2.59(2) | 2.619(17) | 2.597(8) | 2.448(10) |
| Dy1-C2$^a$ | 2.59(2) | 2.617(19) | 2.607(8) | 2.479(10) |
| Dy1-C3$^a$ | 2.58(3) | 2.542(15) | 2.608(7) | 2.704(9) |
| Dy1-C4$^a$ | 2.54(2) | 2.521(15) | 2.594(7) | 2.775(10) |
| Dy1-C5$^a$ | 2.54(2) | 2.580(15) | 2.597(7) | 2.637(10) |
| Dy2-C35(37)$^b$ | 2.62(3) | 2.627(8) | — | — |
| Dy2-C36(38)$^b$ | 2.64(3) | 2.651(7) | — | — |
| Dy2-C37(39)$^b$ | 2.53(3) | 2.646(7) | — | — |
| Dy2-C38(40)$^b$ | 2.56(3) | 2.599(7) | — | — |
| Dy2-C39(41)$^b$ | 2.59(3) | 2.575(8) | — | — |
| Dy2-C52(55)$^b$ | 2.56(3) | 2.627(19) | — | — |
| Dy2-C53(56)$^b$ | 2.66(2) | 2.571(15) | — | — |
| Dy2-C54(57)$^b$ | 2.63(2) | 2.527(17) | — | — |
| Dy2-C55(58)$^b$ | 2.54(3) | 2.587(16) | — | — |
| Dy2-C56(59)$^b$ | 2.59(3) | 2.659(18) | — | — |
| Dy-C(avg) | 2.587(5)$^d$ | 2.600(3)$^d$ | 2.596(2)$^d$ | 2.625(3)$^d$ |
| Dy1-Cp(A)$^c$ | 2.29(2)$^e$ | 2.311(8)$^e$ | 2.297(8)$^e$ | 2.358(10)$^{e,f}$ |
| Dy1-Cp(B)$^c$ | 2.27(3)$^e$ | 2.273(19)$^{e,f}$ | 2.306(8)$^e$ | 2.321(10)$^{e,f}$ |
| Dy2-Cp(C)$^c$ | 2.30(3)$^e$ | 2.319(3)$^e$ | — | — |
| Dy2-Cp(D)$^c$ | 2.29(3)$^e$ | 2.288(3)$^{e,f}$ | — | — |
| Dy-Cp(avg) | 2.29(1)$^d$ | 2.298(5)$^d$ | 2.302(6)$^d$ | 2.340(7)$^d$ |
| Cp(A)-Dy1-Cp(B) | 148.2(8) | 157.35(40)$^f$ | 161.09(20) | 157.82(18) |
| Cp(C)-Dy2-Cp(D) | 146.4(8) | 155.93(30)$^f$ | — | — |

TABLE 2

Structure details for $[Dy(Cp^{iPr4R})_2][B(C_6F_5)_4]$ (R = H (1), Me (2), Et (3), iPr (4)).

| $[DyCp^{iPr4R}_2][B(C_6F_5)_4]$, R = | H (1) | Me (2) | Et (3) | iPr (4) |
|---|---|---|---|---|
| Wavelength (Å) | 0.71073 | 0.7288 | 0.7288 | 0.7288 |
| Crystal system | Monoclinic | Monoclinic | Monoclinic | Monoclinic |
| Space group | $P2_1$ | $P2_1/c$ | $P2_1/n$ | $P2_1/n$ |
| a (Å), α (°) | 16.5863(17), 90 | 14.50(2), 90 | 14.9801(4), 90 | 15.2173(4), 90 |
| b (Å), β (°) | 14.4989(15), 90.0586(16) | 16.63(3), 90.027(12) | 23.0586(7), 90.789(2) | 22.8792(6), 90.605(1) |
| c (Å), γ (°) | 22.708(2), 90 | 46.59(8), 90 | 16.7069(5), 90 | 16.8807(5), 90 |
| V (Å$^3$) | 5461.0(9) | 11236(33) | 5770.4(3) | 5876.9(3) |
| Z | 4 | 8 | 4 | 4 |
| $\rho_{calc}$ (g/cm$^3$) | 1.591 | 1.580 | 1.571 | 1.574 |
| Crystal size (mm$^3$) | 0.338 × 0.187 × 0.044 | 0.107 × 0.057 × 0.05 | 0.130 × 0.060 × 0.050 | 0.110 × 0.071 × 0.071 |
| θ range for data collection (°) | 1.228 to 25.349 | 0.896 to 26.042 | 1.544 to 23.880 | 0.913 to 21.594 |
| Index ranges | −19 ≤ h ≤ 19 | −17 ≤ h ≤ 17 | −16 ≤ h ≤ 16 | −15 ≤ h ≤ 15 |
| | −17 ≤ k ≤ 17 | −20 ≤ k ≤ 20 | 25 ≤ k ≤ 25 | −23 ≤ k ≤ 23 |
| | −27 ≤ l ≤ 27 | −56 ≤ l ≤ 56 | −18 ≤ l ≤ 18 | −17 ≤ l ≤ 17 |
| Reflections collected | 61686 | 163480 | 71765 | 47155 |
| Independent reflections ($R_{int}$) | 19909 (0.0382) | 20570 (0.1408) | 8291 (0.0868) | 6341 (0.0986) |
| Completeness (%) | 99.8 | 100.0 | 100.0 | 100.0 |
| Data/restraints/parameters | 19909/93/634 | 20570/28/1414 | 8291/8/767 | 6341/693/1085 |
| Goodness-of-fit on F$^2$ | 1.069 | 1.035 | 1.056 | 1.060 |
| $R_1$, $wR_2$ [I > 2σ(I)] | 0.0721, 0.1810 | 0.0570, 0.1354 | 0.0682, 0.1589 | 0.0650, 0.1700 |
| $R_1$, $wR_2$ (all data) | 0.0756, 0.1851 | 0.0761, 0.1497 | 0.0854, 0.1711 | 0.0732, 0.1759 |

23

TABLE 3-continued

Bond distances and Angles for for [Dy(Cp$^{iPr4R}$)$_2$][B(C$_6$F$_5$)$_4$] (R = H (1), Me (2), Et (3), iPr (4))

| R = | H (1) | Me (2) | Et (3) | iPr (4) |
|---|---|---|---|---|
| Cp(A)-Dy2-Cp(B) | — | — | — | 158.85(40) |
| Cp(A)-Dy3-Cp(B) | — | — | — | 167.94(152) |
| Cp(A)-Dy4-Cp(B) | — | — | — | 163.91(90) |

[a] C1' to C5' denote the five C atoms of the second Cp ring in the structure. These correspond to C18-C22 for 1, C19-C23 for 2, C20-C24 for 3, and C21-C25 for 4.
[b] C35(37) to C39(41) and C52(55) to C56(59) are the five C atoms of the first and second Cp rings on Dy2 in the structure of 1(2).
[c] Cp(A), Cp(B), Cp(C), and Cp(D) refer to the first (C1-C5), second (C1' to C5') Cp rings on Dy1 and first, second Cp rings on Dy2, respectively.
[d] The standard deviation of the average value was estimated from $\sigma = \sqrt{\Sigma\sigma_i^2/N}$, where $\sigma_i$ is the standard deviation of each bond distance i and N is the number of distances averaged.
[e] Dy-Cp distances were measured from the Dy atom to the centroid of the Cp ring. The standard deviations are estimated as the largest esd of Dy-C distances in the respective Cp ring.
[f] The minor disordered component was not taken into account, as it shows significant deviation from typical Dy-Cp distances, likely due to artefact in disorder.

Example 16: X-Ray Crystallography Data for Yttrium Diamagnetic Analogues of Dy Single Molecule Magnets For [Y(Cp$^{iPr4H}$)$_2$][B(C$_6$F$_5$)$_4$], the compound crystallized in the space group P2$_1$ with two molecules in the asymmetric unit. Initial space group determination suggested significant symmetry fulfillment of an orthorhombic P2$_1$2$_1$2$_1$ cell, which pointed to the sign of pseudo-merohedral twinning about a two-fold rotational axis along the a axis. Refinement with four-component twin yielded the twin ratio of 0.263(19):0.265(11):0.237(11):0.235(11).

One Cp$^{iPr4H}$ ring on [Y(Cp$^{iPr4H}$)$_2$][B(C$_6$F$_5$)$_4$] (C1 to C14) and its disordered iPr group (C13A and C14A) were stabilized by the enhanced rigid bond restraints. The second [Y(Cp$^{iPr4}$)$_2$]+ cation has the Y atom and one Cp$^{iPr4H}$ ligand disordered over two positions. Anisotropic refinement of the disordered Cp$^{iPr4H}$ ring was stabilized by application of equal anisotropic displacement parameters to the 5C ring (C52 to C56 and C52C to C56C), and the four isopropyl groups (C57 to C68 and C57C to C68C). The two [B(C$_6$F$_5$)$_4$]- anions in the asymmetric unit were disordered over two positions and all B and C atoms, and F atoms were subjected to equal anisotropic displacement parameters restraints. The data is shown below in Table 4 below.

For [Y(Cp$^{iPr4Me}$)$_2$][B(C$_6$F$_5$)$_4$], the compound crystallized in the P2$_1$/c space group with two molecules in the asymmetric unit. The crystal was found to be twinned by pseudo-merohedry, and a two-fold rotational axis along the a axis was used as a twin law. Twin refinement results in a two-component twin with a ratio of 0.5378(15):0.4622(15). For each cation in the structure, one Cp ring was found to be disordered over two positions. The occupancies of the two components were refined while constraining the sum to unity and yielded ratios of 0.58:0.42 and 0.59:0.41 for the first and second metallocenium cations, respectively. The disordered Cp rings were constrained to assume the idealized pentagon geometry. Anisotropic refinement of the Y atom resulted in unusually large thermal displacement parameters. Reasonable thermal displacement parameters were achieved when the Y atom was modeled over two positions. The occupancy sum of the two positions was constrained to unity, and the occupancy refined to the ratio of 0.74:0.26 and 0.75:0.25 for the two molecules, respectively. The data is shown below in Table 4 below.

For [Y(Cp$^{iPr4Et}$)$_2$][B(C$_6$F$_5$)$_4$], the compound crystallized in the P2$_1$/n space group with one molecule in the asymmetric unit. All non-H atoms were refined anisotropically. For each Cp ring, one of the isopropyl groups adjacent to the ethyl substituent exhibited signs of disorder. For the first Cp ring, the isopropyl group was modeled such that one —CH$_3$ group (C$_{29}$) was disordered over two positions. Refinement yielded an occupancy ratio of 0.655:0.345. The two isopropyl groups were subjected to rigid bond restraint in order to stabilize the structure refinement. Hydrogen atoms were placed on the geometrically calculated positions using the riding model. Refining one pentafluorophenyl group of the [B(C$_6$F$_5$)$_4$]— anion requires the application of a rigid bond restraint. The data is shown below in Table 4 below.

For [Y(Cp$^{iPr5}$)$_2$][B(C$_6$F$_5$)$_4$], the compound crystallized in the C$_2$/c space group with half a molecule in the asymmetric unit. The [B(C$_6$F$_5$)$_4$]- anion was found to be disordered over two positions. Refinement of the disordered [B(C$_6$F$_5$)$_4$]- was stabilized by the enhanced rigid bond restraints. Hydrogen atoms were placed on the geometrically calculated positions using the riding model. Only the meso isomer was observed in the structure. The data is shown below in Table 4 below.

TABLE 4

Structure details for [Y(Cp$^{iPr4R}$)$_2$][B(C$_6$F$_5$)$_4$] R = H (Y1), Me (Y2), Et (Y3), iPr (Y4).

| [YCp$^{iPr4R}$$_2$][B(C$_6$F$_5$)$_4$], R = | H (Y1) | Me (Y2) | Et (Y3) | iPr (Y4) |
|---|---|---|---|---|
| Wavelength (Å) | 0.71073 | 0.71073 | 0.71073 | 0.71073 |
| Crystal system | Monoclinic | Monoclinic | Monoclinic | Monoclinic |
| Space group | P2$_1$ | P2$_1$/c | P2$_1$/n | C2/c |
| a (Å), α (°) | 16.538(2), 90 | 14.599(10), 90 | 15.0163(5), 90 | 27.336(2), 90 |
| b (Å), β (°) | 14.4952(18), 90.053(2) | 16.737(11), | 23.1163(8), 90.9020(10) | 11.5772(10), 106.0490(10) |
| c (Å), γ (°) | 22.753(3), 90 | 90.253(11) 47.12(3), 90 | 16.7813(6), 90 | 19.4333(17), 90 |
| V (Å$^3$) | 5454.3(12) | 11514(13) | 5824.4(3) | 5910.4(9) |
| Z | 4 | 8 | 4 | 4 |
| ρ$_{calc}$ (g/cm$^3$) | 1.504 | 1.457 | 1.472 | 1.482 |
| Crystal size (mm$^3$) | 0.274 × 0.221 × 0.194 | | 0.492 × 0.224 × 0.138 | 0.327 × 0.268 × 0.140 |
| θ range for data collection (°) | 1.405 to 27.103 | 1.395 to 23.629 | 1.500 to 21.036 | 1.550 to 25.349 |
| Index ranges | −21 ≤ h ≤ 21 −18 ≤ k ≤ 18 −29 ≤ l ≤ 29 | −16 ≤ h ≤ 16 −18 ≤ k ≤ 18 −52 ≤ l ≤ 52 | −15 ≤ h ≤ 15 −23 ≤ k ≤ 23 −16 ≤ l ≤ 16 | −32 ≤ h ≤ 32 −13 ≤ k ≤ 13 −23 ≤ l ≤ 23 |

TABLE 4-continued

Structure details for [Y(Cp$^{iPr4R}$)$_2$][B(C$_6$F$_5$)$_4$] R = H (Y1), Me (Y2), Et (Y3), iPr (Y4).

| [YCp$^{iPr4R}{}_2$][B(C$_6$F$_5$)$_4$], R = | H (Y1) | Me (Y2) | Et (Y3) | iPr (Y4) |
|---|---|---|---|---|
| Reflections collected | 70917 | 84123 | 43460 | 33243 |
| Independent reflections (R$_{int}$) | 24026 (0.0696) | 17198 (0.0538) | 6283 (0.0425) | 5416 (0.0464) |
| Completeness (%) | 99.8 | 99.7 | 100.0 | 100.0 |
| Data/restraints/parameters | 24026/600/970 | 17198/1156/ | 6283/67/770 | 5416/324/599 |
| Goodness-of-fit on F$^2$ | 1.123 | 1.046 | 1.053 | 1.032 |
| R$_1$, wR$_2$ [I > 2σ(I)] | 0.0821, 0.2161 | 0.0769, 0.1922 | 0.0638, 0.1591 | 0.0470, 0.1119 |
| R$_1$, wR$_2$ (all data) | 0.1146, 0.2386 | 0.0909, 0.2027 | 0.0795, 0.1719 | 0.0685, 0.1255 |

Example 17: X-Ray Crystallography Data for Dysprosium (II), Terbium (II) and Terbium (III) Single Molecule Magnets Single crystal X-ray diffraction data of [Tb(Cp$^{iPr5}$)$_2$][B(C$_6$F$_5$)$_4$] and [Tb(Cp$^{iPr5}$)$_2$] were collected as follows (see FIG. 27). The sample was coated with Parabar oil and mounted on a MiTeGen polyimide loop in a nitrogen-filled glovebox. The X-ray intensity data were measured using a Bruker SMART Apex II diffractometer at 100 K under a N2 stream of an Oxford Cryostems Cryostream with MoKα radiation (graphite monochrometer). Data was collected from four 180° ω scans for [Tb(Cp$^{iPr5}$)$_2$][B(C$_6$F$_5$)$_4$] and seven scans for [Tb(Cp$^{iPr5}$)$_2$] with 0.5° steps at 90° rotation intervals about <p and a CCD detector distance of 5 cm. The frames were integrated with the Bruker SAINT Software package using a narrow-frame algorithm.

Single crystals of [Dy(Cp$^{iPr5}$)$_2$] were coated in Paratone-N-oil and mounted on a Kaptan loop. X-ray diffraction data were collected using a Rigaku XtaLAB p200 equipped with a MicroMax-007 HF microfocus rotating anode and a Pilatus 200K hybrid pixel array detector at 100 K under a N$_2$ stream of an Oxford Cryostems Cryostream with MoKα radiation (graphite monochrometer). The frames were integrated with CrysAlis$^{Pro}$ software, including a multi-scan absorption correction that was applied using the SCALE3 ABSPACK scaling algorithm within CrysAlis$^{Pro}$. Initial structure solutions were determined using direct methods (SHELXT) and refinements were carried out using SHELXL-2014.

The compound crystallized in the space group P21/n with one molecule in the asymmetric unit. The anisotropic refinement of the Tb atom resulted in large thermal displacement parameters. The sum of the four Tb positions was constrained to equal an occupancy of one, resulting in a ratio of 0.108:0.353:0.325:0.199. The ten isopropyl groups of the Cp$^{iPr5}$ rings also showed positional disorder and were each modeled over two positions. The refinement was stabilized through application of 1,2 (CH—CH$_3$) and 1,3 (CH$_3$—CH$_3$) distance restraints, as well as enhanced rigid bond restraints. In addition, C$_{Cp}$-C$_{Cp}$—C(H) angles were restrained to be the same. All non-H atoms were refined anisotropically.

Figure 27:
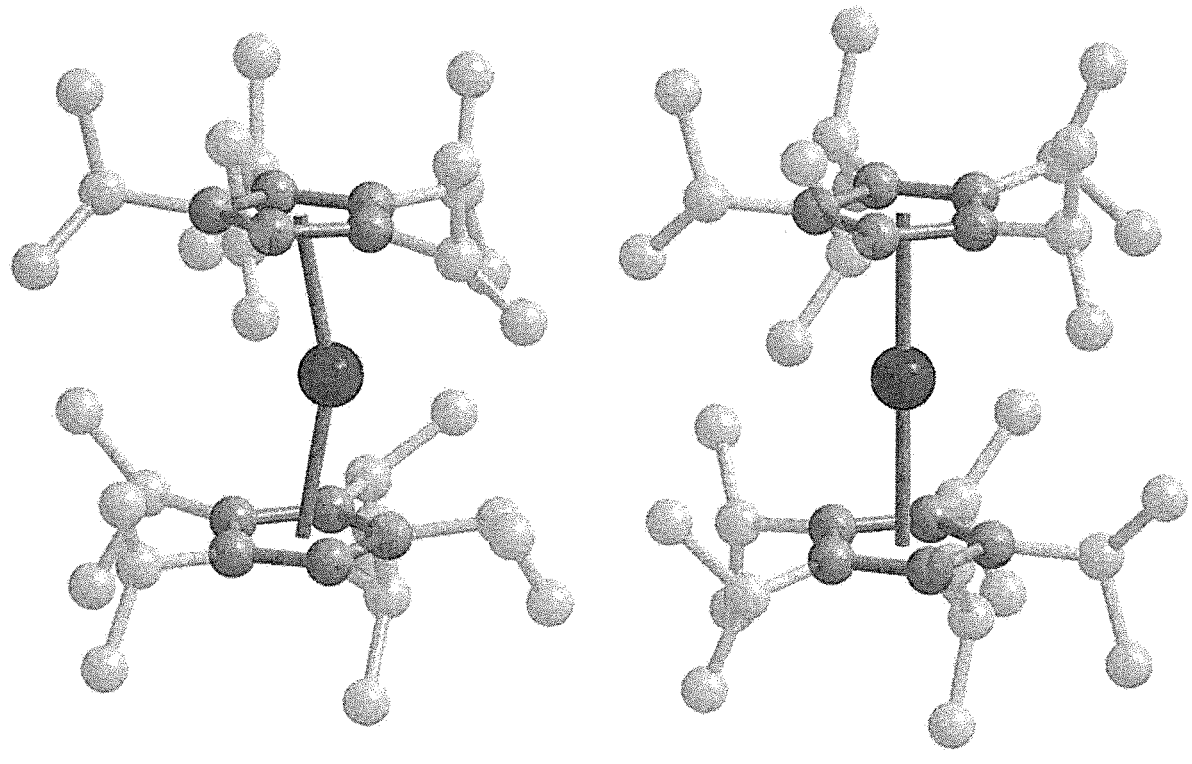
FIG. 27 is the crystal structures of two different examples of molecular complexes described herein.

For [Tb(Cp$^{iPr5}$)$_2$] and [Dy(Cp$^{iPr5}$)$_2$], the compound crystallized in the space group P2$_1$/n with half a molecule in the asymmetric unit. All non-H atoms were refined anisotropically. Tables 5 and 6 below include the structure details for [Tb(Cp$^{iPr5}$)$_2$][B(C$_6$F$_5$)$_4$], [Tb(Cp$^{iPr5}$)$_2$], and [Dy(Cp$^{iPr5}$)$_2$]. The crystal structures for [Tb(Cp$^{iPr5}$)$_2$][B(C$_6$F$_5$)$_4$] and [Tb(Cp$^{iPr5}$)$_2$] are shown in FIG. 27.

TABLE 5

Structure details for [Tb(Cp$^{iPr5}$)$_2$][B(C$_6$F$_5$)$_4$], [Tb(Cp$^{iPr5}$)$_2$], and [Dy(Cp$^{iPr5}$)$_2$].

| Characteristic | [Tb(Cp$^{iPr5}$)$_2$][B(C$_6$F$_5$)$_4$] | Tb(Cp$^{iPr5}$)$_2$ | Dy(Cp$^{iPr5}$)$_2$ |
|---|---|---|---|
| Wavelength (Å) | 0.71073 | 0.71073 | 0.71073 |
| Crystal system | Monoclinic | Monoclinic | Monoclinic |
| Space group | P2$_1$/n | P2$_1$/n | P2$_1$/n |
| a (Å), α (°) | 15.2155(6), 90 | 10.9617(3), 90 | 11.0200(5), 90 |
| b (Å), β (°) | 23.1973(9), 90.9430(10) | 13.0994(4), 91.7570(10) | 13.0196(6), 91.917(5) |
| c (Å), γ (°) | 16.8829(7), 90 | 12.8416(4), 90 | 12.8467(8), 90 |
| V (Å$^3$) | 5955.6(4) | 1843.1(1) | 1842.2(2) |
| Z | 4 | 2 | 2 |
| ρ$_{calc}$ (g/cm$^3$) | 1.551 | 1.279 | 1.286 |
| Crystal size (mm$^3$) | 0.504 × 0.364 × 0.316 | 0.423 × 0.287 × 0.184 | 0.38 × 0.34 × 0.25 |
| θ range for data collection (°) | 1.492 to 25.688 | 2.220 × 30.000 | 2.862 × 25.347 |
| Index ranges | −18 ≤ h ≤ 18 | −15 ≤ h ≤ 15 | −13 ≤ h ≤ 13 |
|  | −28 ≤ k ≤ 28 | −18 ≤ k ≤ 18 | −15 ≤ k ≤ 15 |
|  | −20 ≤ l ≤ 20 | −18 ≤ l ≤ 18 | −15 ≤ l ≤ 15 |
| Reflections collected | 69655 | 45234 | 36352 |
| Independent reflections (R$_{int}$) | 11317 (0.0319) | 5372 (0.0232) | 3365 (0.0774) |
| Completeness (%) | 100.0 | 100.0 | 100.0 |
| Data/restraints/parameters | 11317/1555/1107 | 5372/0/197 | 3365/0/197 |
| Goodness-of-fit on F$^2$ | 1.019 | 1.077 | 1.077 |
| R$_1$, wR$_2$ [I > 2σ(I)] | 0.0570, 0.1534 | 0.0299, 0.740 | 0.0522, 0.1164 |
| R$_1$, wR$_2$ (all data) | 0.0724, 0.1662 | 0.0349, 0.796 | 0.0610, 0.1216 |

TABLE 6

Bond distances (Å) and angles (°)[Tb(Cp$^{iPr5}$)$_2$][B(C$_6$F$_5$)$_4$], [Tb(Cp$^{iPr5}$)$_2$], and [Dy(Cp$^{iPr5}$)$_2$].

| Bond | [Tb(Cp$^{iPr5}$)$_2$][B(C$_6$F$_5$)$_4$] (1)$^a$ | [Tb(Cp$^{iPr5}$)$_2$] | [Dy(Cp$^{iPr5}$)$_2$] |
|---|---|---|---|
| Ln-C1 | 2.660(7) | 2.703(2) | 2.662(5) |
| Ln-C2 | 2.625(7) | 2.704(2) | 2.682(5) |
| Ln-C3 | 2.616(8) | 2.711(2) | 2.680(4) |
| Ln-C4 | 2.600(7) | 2.703(2) | 2.680(4) |
| Ln-C5 | 2.662(8) | 2.702(2) | 2.660(4) |
| Ln-C21 | 2.587(8) | — | — |
| Ln-C22 | 2.702(7) | — | — |
| Ln-C23 | 2.725(7) | — | — |
| Ln-C24 | 2.634(9) | — | — |
| Ln-C25 | 2.536(9) | — | — |
| Ln-C(avg)$^b$ | 2.635(8) | 2.705(2) | 2.673(4) |
| Ln-Cp(A)$^c$ | 2.360(5) | 2.417(1) | 2.385(1) |
| Ln-Cp(B)$^c$ | 2.353(6) | — | — |
| Ln-Cp(avg)$^{b,c}$ | 2.356(6) | 2.417(1) | 2.385(1) |
| Cp(A)-Ln-Cp(B)$^c$ | 159.8(4) | 180.0 | 180.0 |

$^b$Values for 1 are averages over the four positions of the metal atom.
$^b$The standard deviation of the average value was estimated from σ = $\sqrt{\Sigma \sigma_i^2/N}$, where σ$_i$ is the standard deviation of each bond distance i and N is the number of distances averaged.
$^c$Ln-Cp distances and angles were measured from the Ln atom to the centroid of the Cp ring(s).

Example 18: Magnetic Measurements for Dysprosium Single Molecule Magnets

Magnetic samples were prepared by adding crystalline powder (18.2 mg of [Dy(Cp$^{iPr4H}$)$_2$][B(C$_6$F$_5$)$_4$] 19.4 mg of [Dy(Cp$^{iPr4Me}$)$_2$][B(C$_6$F$_5$)$_4$], 15.8 mg of [Dy(Cp$^{iPr4E}$t)$_2$][B(C$_6$F$_5$)$_4$], and 17.7 mg of [Dy(Cp$^{iPr5}$)$_2$][B(C$_6$F$_5$)$_4$]) to a 5 mm i.d./7 mm o.d. quartz tube with a raised quartz platform. A layer of eicosane was added to the samples (21.1 mg for 1, 21.7 mg for 2, 15.9 mg for 3, and 20.4 mg for 4) to provide good thermal contact between the sample and the bath and to prevent crystallite torqueing. The tubes were fitted with Teflon sealable adapters, evacuated using a glovebox vacuum pump, and then flame sealed with an O$_2$/H$_2$ flame under vacuum. After flame-sealing, the eicosane was melted in a 40° C. water bath.

Figure 8:
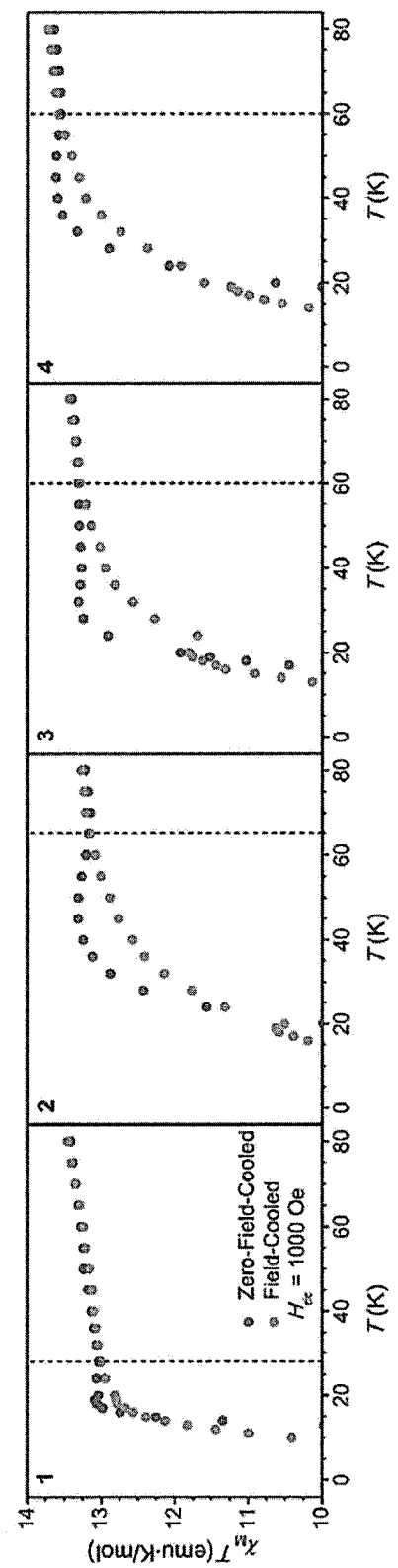
FIG. 8 is plots of the temperature (X-axis, labeled "T(K)") vs. the magnetic susceptibility (Y-axis, labeled "T(emu·K/mol) for different molecular complex examples showing field-cooled (light colored data points) and zero-field cooled (darker data points) magnetic susceptibility measurements at specific temperatures.

Magnetic susceptibility measurements were collected using a Quantum Design MPMS2 SQUID magnetometer. All data were corrected for diamagnetic contributions from the core diamagnetism and for the diamagnetism of the eicosane used to suspend the sample, estimated using Pascal's constants to give corrections of χdia=−0.000670 emu/mol, −0.000694 emu/mol, −0.000717 emu/mol, and −0.000741 emu/mol for [Dy(Cp$^{iPr4H}$)$_2$][B(C$_6$F$_5$)$_4$], [Dp$^{iPr4Me}$)$_2$][B(C$_6$F$_5$)$_4$], [Dy(Cp$^{iPr4Et}$)$_2$][B(C$_6$F$_5$)$_4$], and [Dy(Cp$^{iPr5}$)$_2$][B(C$_6$F$_5$)$_4$]), respectively. The results are shown in FIG. 8. The parameters for the magnetic relaxation data are shown in Table 7 below.

TABLE 7

Parameters for [Dy(Cp$^{iPr4R}$)$_2$][B(C$_6$F$_5$)$_4$] where R is H, Me, Et, or iPr.

| Parameter | R = H | R = Me | R = Et | R = iPr |
|---|---|---|---|---|
| U$_{eff}$ (cm$^{-1}$) | 1285 | 1468 | 1380 | 1334 |
| τ$_0$ (s) | 3.39 × 10$^{-12}$ | 4.01 × 10$^{-12}$ | 7.79 × 10$^{-12}$ | 1.18 × 10$^{-11}$ |
| τ$_{tunnel}$ (s) | 439 | 2452 | 447 | 1187 |
| C | 2.27 × 10$^{-5}$ | 1.57 × 10$^{-6}$ | 3.36 × 10$^{-8}$ | 8.04 × 10$^{-7}$ |
| n | 2.00 | 2.07 | 3.02 | 2.31 |

Magnetically dilute samples of [Dy(Cp$^{iPr4H}$)$_2$][B(C$_6$F$_5$)$_4$], [Dy(Cp$^{iPr4Me}$)$_2$][B(C$_6$F$_5$)$_4$], [Dy(Cp$^{iPr4Et}$)$_2$][B(C$_6$F$_5$)$_4$], and [Dy(Cp$^{iPr5}$)$_2$][B(C$_6$F$_5$)$_4$]) were prepared by co-crystallization of the compound with the Y$^{3+}$ congener [Y(Cp$^{iPr4R}$)$_2$][B(C$_6$F$_5$)$_4$] (R=H, Me, Et, iPr) in roughly a 9:1 Y:Dy molar ratio. The % Dy in this sample was determined by fitting the dc susceptibility curve of the dilution above 60 K to that measured for the undiluted sample. Using this method, the diluted samples [Dy(Cp$^{iPr4H}$)$_2$][B(C$_6$F$_5$)$_4$]@Y, [Dy(Cp$^{iPr4Me}$)$_2$][B(C$_6$F$_5$)$_4$]@Y, [Dy(Cp$^{iPr4E}$)$_2$][B(C$_6$F$_5$)$_4$]@Y, and [Dy(Cp$^{iPr5}$)$_2$][B(C$_6$F$_5$)$_4$]@Y were determined to contain, 10.9, 8.8 11.5, and 8.7% Dy, respectively. The parameters used to fit dc magnetic relaxation data for [Dy(Cp$^{iPr4H}$)$_2$][B(C$_6$F$_5$)$_4$]@Y, [Dy(Cp$^{iPr4Me}$)$_2$][B(C$_6$F$_5$)$_4$]@Y, [Dy(Cp$^{iPr4Et}$)$_2$][B(C$_6$F$_5$)$_4$]@Y, and [Dy(Cp$^{iPr5}$)$_2$][B(C$_6$F$_5$)$_4$]@Y are shown below in Tables 8-11.

TABLE 8

Parameters used to fit dc magnetic relaxation data for the dilution [Dy(Cp$^{iPr4H}$)$_2$][B(C$_6$F$_5$)$_4$]@Y.

| T (K) | M$_0$ (μ$_b$) | M$_1$ (μ$_b$) | n | τ (s)$^a$ |
|---|---|---|---|---|
| 2 | 3.26016 | 0.84486* | 0.755 | 1782.653 |
| 22 | 0.08344 | 0.00103 | 0.864 | 89.616 |
| 24 | 0.04897 | 0.00066 | 0.867 | 75.471 |
| 26 | 0.02306 | 0.00062 | 0.886 | 67.707 |
| 28 | 0.01203 | 0.00051 | 0.827 | 62.363 |
| 30 | 0.00634 | 0.00040 | 0.934 | 58.116 |

*M$_1$ values obtained by treating M$_1$ as a free variable
$^a$Values for τ are likely only accurate to three significant figures.

TABLE 9

Parameters used to fit dc magnetic relaxation data for the dilution [Dy(Cp$^{iPr4Me}$)$_2$][B(C$_6$F$_5$)$_4$]@Y.

| T (K) | M$_0$ (μ$_b$) | M$_1$ (μ$_b$) | n | τ (s)$^a$ |
|---|---|---|---|---|
| 2 | 3.16566 | 0.15983* | 0.583 | 11200.173 |
| 56 | 0.07237 | 0.00134 | 0.943 | 146.308 |
| 58 | 0.05892 | 0.00112 | 0.958 | 126.621 |
| 60 | 0.04713 | 0.00030 | 0.906 | 115.470 |
| 62 | 0.03457 | 0.00044 | 0.953 | 105.074 |
| 64 | 0.02213 | 0.00037 | 1.000 | 93.667 |

*M$_1$ values obtained by treating M$_1$ as a free variable
$^a$Values for τ are likely only accurate to three significant figures.

TABLE 10

Parameters used to fit dc magnetic relaxation data for the dilution [Dy(Cp$^{iPr4Et}$)$_2$][B(C$_6$F$_5$)$_4$]@Y.

| T (K) | M$_0$ (μ$_b$) | M$_1$ (μ$_b$) | n | τ (s)$^a$ |
|---|---|---|---|---|
| 2 | 3.213927 | 1.06550* | 0.726 | 1125.215 |
| 56 | 0.02068 | 0.00038 | 0.926 | 135.265 |
| 58 | 0.01548 | 0.00027 | 0.928 | 117.742 |
| 60 | 0.00927 | 0.00028 | 1.000 | 107.402 |
| 62 | 0.00496 | 0.00021 | 0.910 | 75.897 |
| 64 | 0.00265 | 0.00020 | 0.998 | 62.907 |

*M$_1$ values obtained by treating M$_1$ as a free variable
$^a$Values for τ are likely only accurate to three significant figures..

TABLE 11

Parameters used to fit dc magnetic relaxation data for the dilution [Dy(Cp$^{iPr5}$)$_2$][B(C$_6$F$_5$)$_4$]@Y.

| T (K) | M$_0$ (μ$_b$) | M$_1$ (μ$_b$) | n | τ (s)$^a$ |
|---|---|---|---|---|
| 2 | 3.70041 | 1.27894* | 0.720 | 1956.098 |
| 54 | 0.04907 | 0.00084 | 0.913 | 112.065 |
| 56 | 0.03621 | 0.00053 | 0.894 | 100.429 |

TABLE 11-continued

Parameters used to fit dc magnetic relaxation data for the dilution [Dy(Cp$^{iPr5}$)$_2$][B(C$_6$F$_5$)$_4$]@Y.

| T (K) | M$_0$ (μ$_b$) | M$_1$ (μ$_b$) | n | τ (s)$^a$ |
|---|---|---|---|---|
| 58 | 0.02640 | 0.00056 | 0.921 | 89.353 |
| 60 | 0.01566 | 0.00050 | 0.879 | 72.127 |
| 62 | 0.00865 | 0.00041 | 0.737 | 60.019 |

*M$_1$ values obtained by treating M$_1$ as a free variable
$^a$Values for τ are likely only accurate to three significant figures.

Example 19: Magnetic Measurements for Terbium and Lanthanide (H) Single Molecule Magnets Magnetic samples were prepared as previously described herein in Example 18. The samples were 18.2 mg for [Tb(Cp$^{iPr5}$)$_2$][B(C$_6$F$_5$)$_4$], 18.2 mg for [Tb(Cp$^{iPr5}$)$_2$], and 22.0 mg for [Dy(Cp$^{iPr5}$)$_2$]. All data were corrected for diamagnetic contributions using Pascal's constants to give corrections of χdia=−0.000741 emu/mol, −0.000464 emu/mol, and −0.000464 emu/mol for Tb(Cp$^{iPr5}$)$_2$][B(C$_6$F$_5$)$_4$], [Tb(Cp$^{iPr5}$)$_2$], and [Dy(Cp$^{iPr5}$)$_2$].

Figure 9:
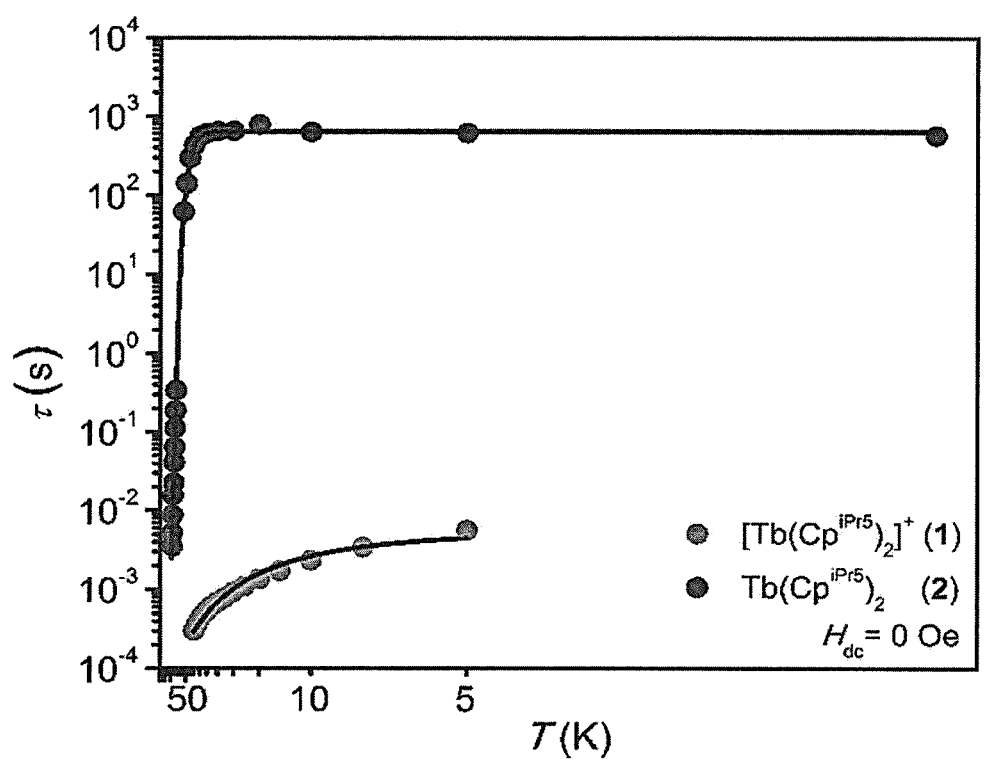
FIG. 9 is a plot of the temperature (X-axis, labeled "T(K)") vs. the magnetic relaxation time (ti (s)) for polycrystalline samples of [Tb(Cp$^{iPr5}$)$_2$]+ and Tb(Cp$^{iPr5}$)$_2$.
Figure 10:
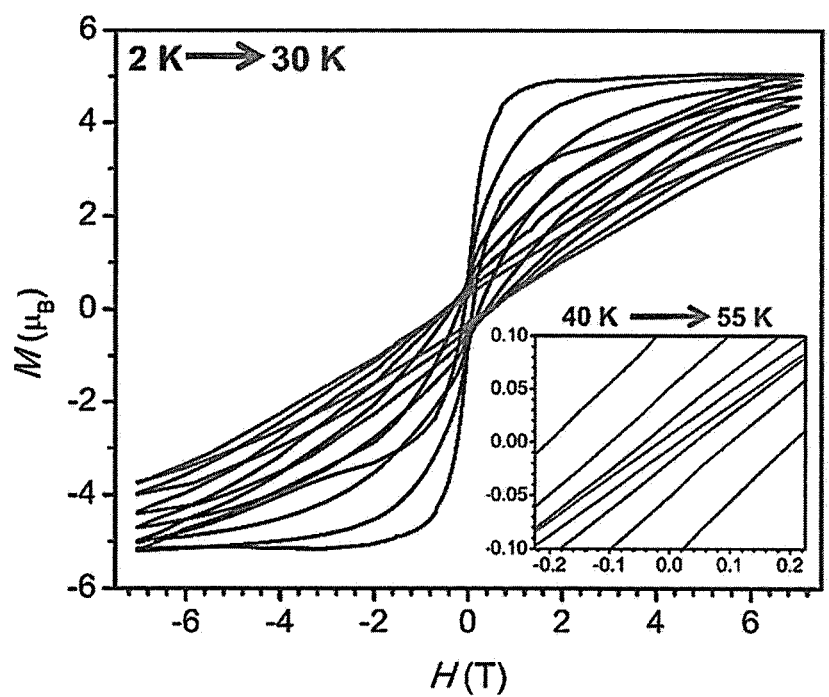
FIG. 10 is a plot of magnetic hysteresis with applied field (X-axis, labeled "H(T)") vs. the remanent magnetization (Y-axis, labeled "M($\mu_B$)") at sweep rates of 14.7(1) mT/s for H>2 T and 3.9(2) mT/s for H<2 T for a molecular complex described herein.

Magnetic measurements were also conducted on frozen toluene solutions of [Tb(Cp$^{iPr5}$)$_2$] and [Dy(Cp$^{iPr5}$)$_2$] (19 mM and 28 mM, respectively) to ensure that the observed magnetic properties were molecular in origin and not due to long-range interactions in the solid-state. These frozen solutions correspond to an average Tb—Tb separation of 44 Å in 19 mM of [Tb(Cp$^{iPr5}$)$_2$] and an average Dy—Dy separation of 39 Å in 28 mM of [Dy(Cp$^{iPr5}$)$_2$]. The parameters for each of the three single molecule magnets are listed below in Tables 12, 13, and 14. Magnetic relaxation and hysteresis data for [Tb(Cp$^{iPr5}$)$_2$] are displayed in FIG. 9 and FIG. 10, respectively.

TABLE 12

Parameters used to fit the Arrhenius plots of [Tb(Cp$^{iPr5}$)$_2$][B(C$_6$F$_5$)$_4$].

| | Polycrystalline 1 H$_{dc}$ = 0 Oe |
|---|---|
| U$_{eff}$ (cm$^{-1}$) | — |
| τ$_0$ (s) | — |
| τ$_{tunnel}$ (s) | 5.72 × 10$^{-3}$ |
| C | 2.04 |
| n | 2.00 |

TABLE 13

Parameters used to fit the Arrhenius plots of [Tb(Cp$^{iPr5}$)$_2$].

| | Polycrystalline 2 H$_{dc}$ = 0 Oe | Polycrystalline 2 H$_{dc}$ = 500 Oe | 19 mM Solution 2 H$_{dc}$ = 0 Oe | 19 mM Solution 2 H$_{dc}$ = 500 Oe |
|---|---|---|---|---|
| | | Fast Process | | |
| U$_{eff}$ (cm$^{-1}$) | — | — | n/a | n/a |
| τ$_0$ (s) | — | — | n/a | n/a |
| τ$_{tunnel}$ (s) | 7.92 × 10$^{-1}$ | 7.92 × 10$^{-1}$ | n/a | n/a |
| C | — | — | n/a | n/a |
| n | — | — | n/a | n/a |
| | | Slow Process | | |
| U$_{eff}$ (cm$^{-1}$) | 1205 | — | — | — |
| τ$_0$ (s) | 2.46 × 10$^{-11}$ | — | — | — |
| τ$_{tunnel}$ (s) | 6.42 × 10$^2$ | 7.95 × 10$^{-2}$ | 2.54 × 10$^2$ | 2.99 × 10$^6$ |
| C | 9.69 × 10$^{-18}$ | 1.00 × 10$^{-13}$ | 9.69 × 10$^{-18}$ | 2.07 × 10$^{-10}$ |
| n | 8.69 | 6.31 | 8.69 | 4.22 |

TABLE 14

Parameters used to fit the Arrhenius plots of [Dy(Cp$^{iPr5}$)$_2$].

| | Polycrystalline 3 H$_{dc}$ = 0 Oe | Polycrystalline 3 H$_{dc}$ = 500 Oe | 28 mM Solution 3 H$_{dc}$ = 0 Oe | 28 mM Solution 3 H$_{dc}$ = 500 Oe |
|---|---|---|---|---|
| | | Fast Process | | |
| U$_{eff}$ (cm$^{-1}$) | — | 37.4 | 37.4 | 37.4 |
| τ$_0$ (s) | — | 9.57 × 10$^{-6}$ | 9.57 × 10$^{-6}$ | 1.30 × 10$^{-5}$ |
| τ$_{tunnel}$ (s) | 1.54 × 10$^{-4}$ 2.00 × 10$^{-1}$ | — | — | — |
| C | — | 5.63 × 10$^{-3}$ | 9.33 × 10$^{-1}$ | 1.43 × 10$^{-2}$ |
| n | — | 4.34 | 2.00 | 3.65 |
| | | Slow Process | | |
| U$_{eff}$ (cm$^{-1}$) | Not observed | — | — | — |
| τ$_0$ (s) | Not observed | — | — | — |
| τ$_{tunnel}$ (s) | Not observed | 2.24 × 10$^2$ | 1.65 × 10$^3$ | 1.49 × 10$^4$ |
| C | Not observed | 2.87 × 10$^{-8}$ | 1.29 × 10$^{-5}$ | 4.94 × 10$^{-7}$ |
| n | Not observed | 2.89 | 3.11 | 2.22 |

As used herein, the term "about" is used to provide flexibility to a numerical range endpoint by providing that a given value may be "a little above" or "a little below" the endpoint. The degree of flexibility of this term can be dictated by the particular variable and would be within the knowledge of those skilled in the art to determine based on experience and the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Unless otherwise stated, any feature described herein can be combined with any aspect or any other feature described herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range. For example, a range from about 100° C. to about 200° C. should be interpreted to include not only the explicitly recited limits of about 100° C. to about 200° C., but also to include individual values, such as 125° C., 150° C., 175° C., etc., and sub-ranges, such as from about 150° C. to about 175° C., etc.

In describing and claiming the examples disclosed herein, the singular forms "a", "an", and "the" include plural referents unless the context clearly dictates otherwise.

What is claimed is:

1. A method for making a molecular complex consisting of a cationic lanthanide metal (Ln) and two anionic ligands (L), wherein
one of the two anionic ligands is an anionic carbon ring ligand, and
the anionic carbon ring ligand is selected from the group consisting of cyclopentadienyl $(C_5R_5)^-$, cyclononatetraenyl $(C_9R_9)^-$, a carbon ring ligand containing heteroatoms $(C_4R_4P)^-$, cyclobutadienyl $(C_4R_4)^{2-}$, and cyclooctatetraenyl $(C_5R_5)^{2-}$, where R is a hydrogen, a branched or linear alkyl group, a phenyl group, or a branched or linear silyl group, and the amount of carbons in each of the branched or linear alkyl group, the phenyl group, and the branched or linear silyl group is equal to or less than 12,
the method comprising:
reacting an anhydrous lanthanide(III) halide $(LnX_3)$, lanthanide(II) halide $(LnX_2)$, or lanthanide(III) borohydride with ligand salts in a non-coordinating solvent, thereby forming a lanthanide-bis(ligand) halide complex, lanthanide-bis(ligand) borohydride complex, neutral trivalent lanthanide-bis(ligand) complex, or a neutral divalent lanthanide-bis(ligand) complex;
isolating the lanthanide-bis(ligand) halide complex, neutral trivalent lanthanide-bis(ligand) complex, the lanthanide-bis(ligand) borohydride complex, or the neutral divalent lanthanide-bis(ligand) complex; and
performing one of the following steps:
i) reacting the lanthanide-bis(ligand) halide complex or lanthanide-bis(ligand) borohydride complex with a reducing agent, thereby forming a neutral divalent lanthanide-bis(ligand) complex, and purifying the neutral divalent lanthanide-bis(ligand) complex, thereby forming the molecular complex wherein the molecular complex has a charge of 0; or
ii) purifying the neutral trivalent lanthanide-bis(ligand), thereby forming the molecular complex wherein the molecular complex has a total charge of 0.

2. The method of claim 1, wherein the anhydrous lanthanide halide is $LnX_3$ or $LnX_2$, where X is selected from the group consisting of Cl, Br, or I.

3. The method of claim 2, wherein Ln is selected from the group consisting of dysprosium (III), yttrium (III), terbium (III), lanthanum (III), cerium (III), Praseodymium (III), neodymium (III), promethium (III), samarium (III), europium (III), gadolinium (III), holmium (III), erbium (III), thulium (III), ytterbium (III), lutetium(III), dysprosium (II), yttrium (II), terbium (II), lanthanum (II), cerium (II), Praseodymium (II), neodymium (II), promethium (II), samarium (II), europium (II), gadolinium (II), holmium (II), erbium (II), thulium (II), ytterbium (II), and lutetium(II).

4. The method of claim 1, wherein the molecular complex has a structure represented by a general formula of $Ln(L)_2$.

* * * * *